(12) United States Patent
Jeffs et al.

(10) Patent No.: US 7,043,032 B1
(45) Date of Patent: May 9, 2006

(54) TONE-CONTROL CIRCUIT AND METHOD FOR CONDITIONING RESPECTIVE FREQUENCY BANDS OF AN AUDIO SIGNAL

(75) Inventors: Philip R. Jeffs, Snohomish, WA (US); Dennis A. Bohn, Mukilteo, WA (US)

(73) Assignee: Rane Corporation, Mukilteo, WA (US)

(*) Notice: Subject to any disclaimer, the term of this patent is extended or adjusted under 35 U.S.C. 154(b) by 0 days.

(21) Appl. No.: 09/333,759

(22) Filed: Jun. 15, 1999

(51) Int. Cl.
    H03G 5/00 (2006.01)

(52) U.S. Cl. .......................... 381/101; 381/98; 381/97

(58) Field of Classification Search .................. 381/99, 381/119, 101, 97, 98, 103; 333/28 T, 167, 333/175, 176; 327/551, 556–559
See application file for complete search history.

(56) References Cited

U.S. PATENT DOCUMENTS

| | | | | |
|---|---|---|---|---|
| 4,137,510 A | * | 1/1979 | Iwahara | 333/132 |
| 4,229,619 A | * | 10/1980 | Takahashi et al. | 381/99 |
| 4,569,076 A | * | 2/1986 | Holman | 381/82 |
| 4,769,848 A | * | 9/1988 | Eberbach | 381/97 |
| 4,888,789 A | * | 12/1989 | Orban | 375/230 |
| 5,325,435 A | * | 6/1994 | Date et al. | 381/1 |
| 5,642,429 A | * | 6/1997 | Janssen | 381/182 |
| 5,717,773 A | * | 2/1998 | Maag et al. | 381/98 |
| 5,748,754 A | * | 5/1998 | Maag et al. | 381/104 |
| 5,832,097 A | * | 11/1998 | Armstrong et al. | 381/321 |
| 5,892,833 A | * | 4/1999 | Maag et al. | 381/98 |
| 5,907,622 A | * | 5/1999 | Dougherty | 381/57 |
| 5,930,374 A | * | 7/1999 | Werrbach et al. | 381/99 |

\* cited by examiner

Primary Examiner—Xu Mei
(74) Attorney, Agent, or Firm—Black Lowe & Graham PLLC

(57) ABSTRACT

An audio tone-control circuit includes $4^{th}$-order low-pass, $4^{th}$-order band-pass, and $4^{th}$-order high-pass filter circuits. The $4^{th}$-order low-pass filter circuit has a first phase response and receives and filters an audio signal and generates a first output signal therefrom. The $4^{th}$-order band-pass filter circuit has a second phase response that is substantially equal to the first phase response and receives and filters the audio signal to generate a second output signal. The $4^{th}$-order high-pass filter circuit has a third phase response substantially equal to the first and second phase responses and receives and filters the audio signal to generate a third output signal. The audio-signal circuit also includes a combining circuit that combines the first, second and third output signals into a combined signal. Furthermore, the filter circuits may be $2^{nd}$-order filter circuits instead of $4^{th}$-order filter circuits.

29 Claims, 25 Drawing Sheets

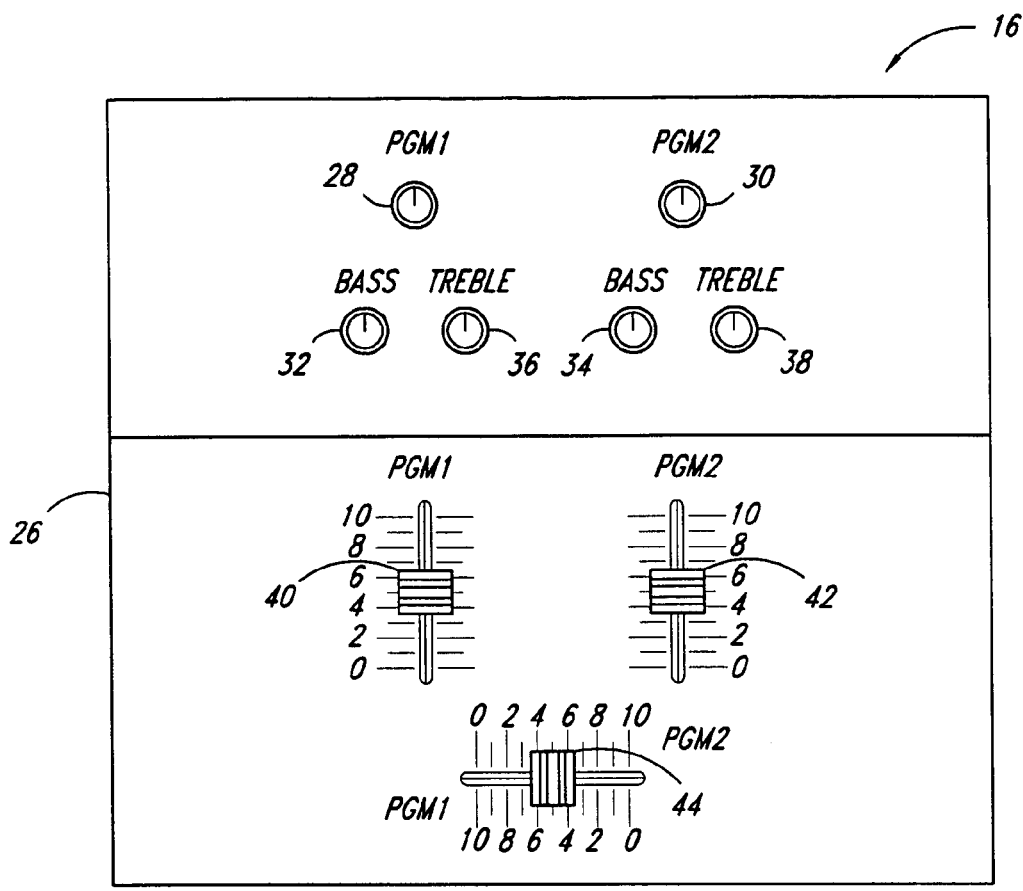
Fig. 2 (PRIOR ART)
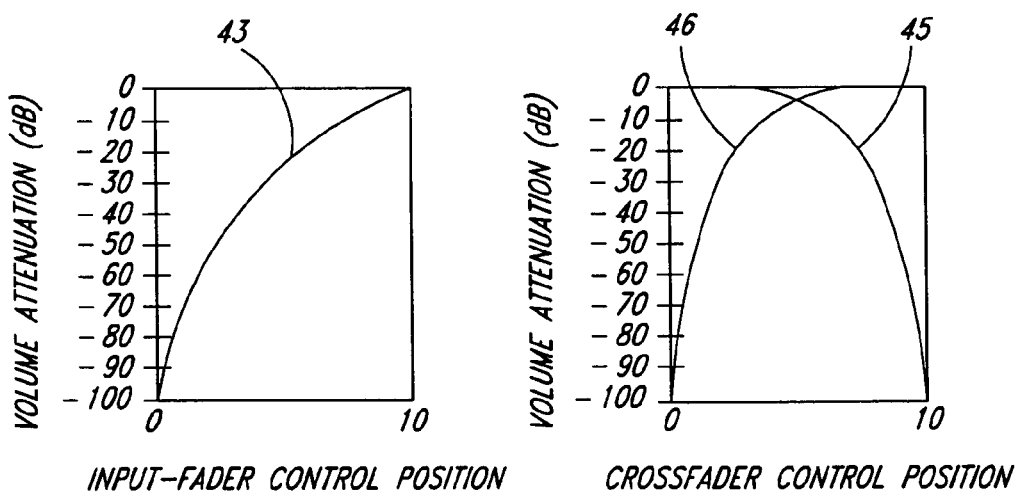
Fig. 3 (PRIOR ART)
Fig. 4 (PRIOR ART)

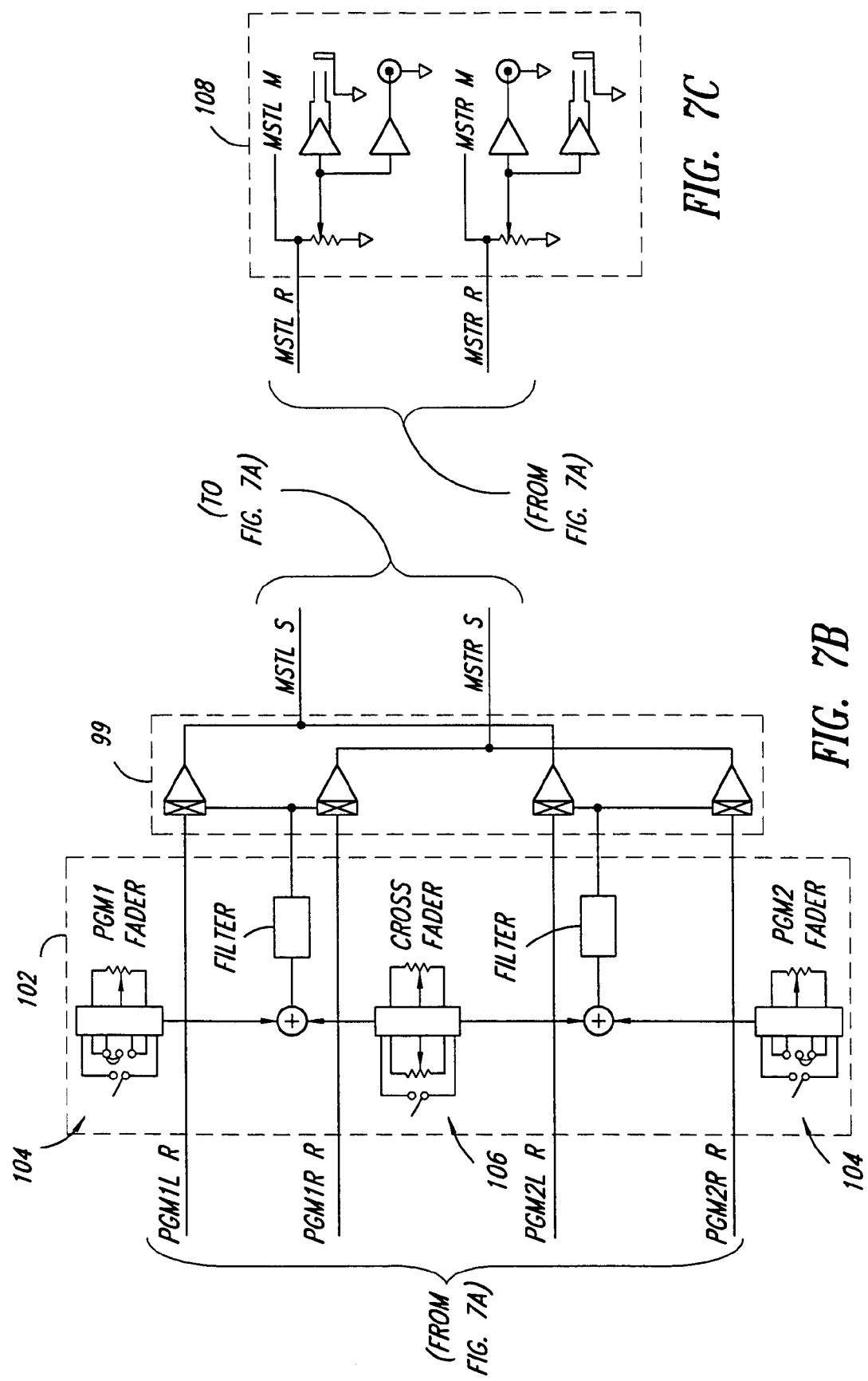

US 7,043,032 B1

TONE-CONTROL CIRCUIT AND METHOD FOR CONDITIONING RESPECTIVE FREQUENCY BANDS OF AN AUDIO SIGNAL

TECHNICAL FIELD

The invention relates generally to electronic circuits, and more particularly, to an improved tone-control circuit and method for controlling the gains of one or more of the bass, mid, and treble frequency bands of an audio signal.

BACKGROUND OF THE INVENTION

Within the last few years, the music world has witnessed the birth and increasing popularity of a new type of composer/performer known as a "turntablist". Generally, a turntablist performs a musical piece by manually rotating one or more conventional phonographic records to generate musical sounds.

FIG. 1 is a schematic block diagram of a conventional sound system 10 that is used by many of today's turntablists. The system 10 includes a pair of turntables 12 and 14, which amplify the sounds from respective phonographic records 13 and 15. The turntables 12 and 14 respectively provide first (PGM1) and second (PGM2) program audio signals to an audio mixer 16, which mixes these signals together to generate a mixed master audio signal (MASTER). An optional effects box 18 generates a signal (MASTER EFFECTS) by adding audio effects to the MASTER signal. Typically, the PGM1, PGM2, MASTER, and MASTER EFFECTS signals are stereo signals having respective left (L) and right (R) components. A house amplifier 20 amplifies the MASTER EFFECTS signal and provides its L and R components to speakers 22 and 24, respectively.

FIG. 2 is a control panel 26 of the mixer 16 of FIG. 1. The mixer 16 includes gain controls 28 and 30 for respectively adjusting the gains of the PGM1 and PGM2 signals (FIG. 1) over their entire frequency ranges, bass controls 32 and 34 for respectively adjusting the gains of the low-frequency components of PGM1 and PGM2, and treble controls 36 and 38 for respectively adjusting the gains of the high-frequency components of PGM1 and PGM2. Because the turntables 12 and 14 (FIG. 1) may provide PGM1 and PGM2 with different gains, the controls 28 and 30 allow the turntablist to compensate for these gain differences so that PGM1 and PGM2 have the same amplitude characteristics before the mixer 16 processes them further. Additionally, the turntablist may set the controls 32, 34, 36, and 38 to attenuate or amplify the bass or treble-bands of PGM1 and PGM2, respectively. For example, the turntablist may want to isolate a singing voice from the record 13. Because the frequency components of a human voice lie mainly in the mid band between the bass and treble-bands, the turntablist adjusts the controls 32 and 36 for full attenuation, i.e., "cut", so that ideally only the mid-band frequency components of PGM1 are audible in the MASTER EFFECTS signal (or the MASTER signal if the effects box 18 is not included in the system 10).

The mixer 16 also includes input-fader controls 40 and 42 for adjusting the volumes of PGM1 and PGM2—as heard in the MASTER signal—after PGM1 and PGM2 have been processed by the amplification circuitry controlled by the controls 28, 30, 32, 34, 36, and 38. Typically, the fader controls 40 and 42 are respective sliding controls, such as sliding potentiometers, that the turntablist uses to vary the respective volumes of PGM1 and PGM2 for musical effect while he is playing his piece.

FIG. 3 is a plot of a curve 43, which shows the attenuation in decibels (dB) of PGM1 and PGM2 versus the control position for a known version of the input-fader controls 40 and 42, respectively, of FIG. 2. For clarity here and below, the characteristics and operation of the control 40 are discussed, it being understood that the characteristics and operation of the control 42 are similar. In operation, referring to both FIGS. 2 and 3, if the control 40 is in the "0", i.e., cutoff, position, then the volume of PGM1 is −100 dB, i.e., 100 dB down, and for all practical purposes PGM1 has zero volume and is thus inaudible in the MASTER EFFECTS signal. Conversely, if the control 40 is in the "10", i.e., full, position, then the volume of PGM1 is 0 dB, which is full volume in this version of the control 40.

Referring to FIGS. 2 and 3, the mixer 16 may include reversal controls (not shown in FIG. 2)—one for each of the controls 40 and 42—for reversing the cutoff and full positions of the controls 40 and 42, respectively. Such controls are known as "hamsters" in turntablist jargon, and are included so that the turntablist can attain the most comfortable hand positions while performing his piece. In operation, if the reversal control is in one position, then the "0" position of the control 40 is the cutoff position and the "10" position is the full position as discussed above. Conversely, if the reversal control is in another position, then the "0" position is the full position and the "10" position is the cutoff position.

Referring again to FIGS. 2 and 3, the mixer 16 may include contour controls (not shown in FIG. 2)—one for each of the controls 40 and 42—for adjusting the shape of the curve 43. Contour controls typically allow the turntablist more flexibility in playing his musical piece. In operation, a change in the shape of the curve 43 changes the distance that the turntablist must move the control 40 to get a given change in the volume of PGM1. For example, the turntablist may want to transition PGM2 from cutoff to full volume by moving the control 40 only a fraction of the distance between the "0" and "10" positions instead of the entire distance as the illustrated shape of the curve 43 requires. Therefore, the turntablist sets the contour control such that the curve 43 has a shape that is steeper in the cutoff region than illustrated in FIG. 3.

Referring again to FIG. 2, the mixer 16 also includes a crossfader control 44 for adjusting the ratio of the volume of PGM1 to the volume of PGM2—the volumes of PGM1 and PGM2 also being set by the fader controls 40 and 42, respectively—in the MASTER signal. Like the fader controls 40 and 42, the crossfader control 44 is typically a sliding control that the turntablist uses to vary this volume ratio for musical effect while he is playing his piece.

FIG. 4 is a plot of curves 45 and 46, which respectively show the attenuation in decibels for PGM1 and PGM2 versus the control position for a known embodiment of the crossfader control 44. In operation, referring to both FIGS. 2 and 4, if the control 44 is all the way to the left in the PGM1"10"/PGM2"0" position, i.e., full position for PGM1 and cutoff position for PGM2, then the volume of PGM1 is full and the volume of PGM2 is 100 dB down, and for all practical purposes PGM1 is the only audible component of the MASTER EFFECTS signal. Conversely, if the control 44 is all the way to the right in the PGM1 "0"/PGM2 "10" position, i.e., cutoff position for PGM1 and full position for PGM2, then the volume of PGM1 is 100 dB down and the volume of PGM2 is full, and for all practical purposes PGM2 is the only audible component of the MASTER EFFECTS signal.

The mixer 16 may also include a reversal control, i.e., "hamster" (not shown in FIG. 2), for reversing the cutoff and full positions of the control 44 with respect to PGM1 and PGM2. In operation, if the reversal control is in one position, then the leftmost position of the control 44 is the PGM1-full/PGM2-cutoff position and the rightmost position is the PGM1-cutoff/PGM2-full position as discussed above. Conversely, if the reversal control is in another position, then the leftmost position of the control 44 is the PGM1-cutoff/PGM2-full position and the rightmost position is the PGM1-full/PGM2-cutoff position.

Still referring to FIGS. 2 and 4, the mixer 16 may also have a contour control (not shown in FIG. 2) for adjusting the shapes of the curves 45 and 46 in a manner similar to that discussed above for adjusting the shape of the curve 43 of FIG. 3. Furthermore, the illustrated shapes of the curves 45 and 46 may represent a constant-power crossfader contour. In other words, regardless of the position of the crossfader control 44, the sum of the powers, and thus the volumes, of PGM1 and PGM2 in the MASTER EFFECTS signal equals a constant level.

Unfortunately, movement of the fader controls 40 and 42 often adds audible levels of noise called "travel" noise, to PGM1 and PGM2, respectively. Additionally, because they are in the respective PGM1 and PGM2 signal paths, the fader controls 40 and 42 may allow audible levels of PGM1 and PGM2 to "bleed into" the MASTER EFFECTS signal even if the controls 40 and 42, respectively, are in their full-cut positions.

One way to reduce both travel noise and signal bleed through is to use high quality, low-noise controls, such as low-noise potentiometers, for the controls 40 and 42. But these low-noise potentiometers are relatively expensive, and, like their cheaper counterparts, soon wear down to a point where they generate unacceptable travel noise or allow unacceptable signal bleed through, and thus must be replaced.

Another way to reduce the travel noise is to remove the input-fader controls 40 and 42 from the PGM1 and PGM2 signal paths, respectively. Thus the output signals from the controls 40 and 42 can be filtered and then used to control the gain of an audio amplifier. Unfortunately, such designs are frequently expensive, complex, and lack the consistent performance required by turntablists. For example, the filter may cause the controls 40 and 42 to exhibit inappropriate volume-increase and volume-decrease rates—often called "attack" and "decay" rates, respectively—which may compromise the ability of the filter to remove travel noise without adversely altering the performance of the turntablist. In addition, such designs frequently require a separate gain-controlled amplifier for each fader control 40 and 42, thus making the input-fader circuit too complex and expensive for compact performance mixers.

The crossfader control 44 may also add audible levels of travel noise and signal "bleed" to PGM1 and PGM2. Noise-reduction techniques similar to those discussed above for the controls 40 and 42 may be used to reduce the travel noise generated by the crossfader control 44. Unfortunately, these techniques often exhibit the same shortcomings as the above-described techniques.

Furthermore, many crossfader contour controls lack a constant-power setting. And like the input-fader circuits, the crossfader circuit may allow audible levels of PGM1 and PGM2 to bleed into the MASTER EFFECTS signal even if the control 44 is in its respective PGM1-full-cut or PGM2-full-cut position.

Furthermore, the input-fader circuits are often highly sensitive to component tolerances such that the same absolute positions of the respective controls 40 and 42 may provide different attenuations for different mixers 16. For example, suppose that controls 40 of two mixers 16 are in their respective "6" positions. Because of the high sensitivities of the respective input-fader circuits, however, the first mixer may attenuate PGM1 by 20 dB and the second mixer may attenuate PGM1 by 18 dB. Often, the turntablist practices on one mixer 16 and performs on another mixer 16, and is, therefore, used to the position-attenuation characteristics for the controls 40 and 42 of the practice mixer. Consequently, if the position-attenuation characteristics of the performance mixer are different than those of the practice mixer, then the performed piece will not sound as the turntablist intended. Thus, differences in the input-fader position-attenuation characteristics between the practice and performance mixers can ruin the turntablists performance!

Like the input-fader circuits, the crossfader circuit is often highly sensitive to component tolerances, and thus may cause the crossfader control 44 to exhibit different position-attenuation characteristics from mixer to mixer. Moreover, because the design of the crossfader circuit is often complex, the crossfader circuit often requires a relatively large number of components and thus contributes significantly to the cost, size, and power consumption of the mixer 16.

Furthermore, referring to FIG. 1, if the turntablist wants to use the effects box 18 to add audio effects to either PGM1 or PGM2, then he must disconnect the box 18 from MASTER and reconnect it between the respective turntable 12 or 14 and the mixer 16. This makes it virtually impossible for the turntablist to add effects to more than one of the PGM1, PGM2, and MASTER signals while he plays his piece. One solution is to use three effects boxes 18: one for PGM1, one for PGM2, and one for MASTER. But unfortunately, because the effects box 18 is a relatively expensive item, most turntablists can afford to have only one.

Moreover, to allow independent gain control of the bass and treble frequency components, the mixer 16 often includes bass-band, mid-band, and treble-band filters, which are collectively called a tone-control circuit or simply a tone control. Unfortunately, the frequency cutoff slopes of many tone-control circuits are not steep enough to allow for such independent gain control. One solution is to use a $4^{th}$-order tone-control circuit. But the filters used in a $4^{th}$-order tone-control circuit often have relatively large numbers of components, and thus often increase the cost, size, and power consumption of the mixer 16.

SUMMARY OF THE INVENTION

In one aspect of the invention, an audio-signal circuit includes a $4^{th}$-order low-pass filter circuit having a first phase response, the filter circuit receiving and filtering an audio signal and generating a first output signal therefrom, a $4^{th}$-order band-pass filter having a second phase response that is substantially equal to the first phase response, the band-pass filter circuit receiving and filtering the audio signal to generate a second output signal, a $4^{th}$-order high-pass filter circuit having a third phase response substantially equal to the first and second phase responses, the high-pass filter circuit receiving and filtering the audio signal to generate a third output signal, and a combining circuit that combines the first, second and third output signals into a combined signal. In another embodiment, the audio signal circuit is implemented with $2^{nd}$-order filters instead of $4^{th}$-order filters.

Such a circuit provides useful levels of isolation between the frequency bands of an audio signal with significantly fewer components than prior circuits. Thus, such a circuit costs significantly less to manufacture than prior circuits, and also occupies a reduced circuit board area, which contributes to a significantly lower cost of a device such as an audio mixer that incorporates the filter circuit.

BRIEF DESCRIPTION OF THE DRAWINGS

FIG. 2 shows the control panel for the audio mixer of FIG. 1.

FIG. 3 is a plot of signal attenuation versus control position for the input-fader controls of FIG. 2.

FIG. 4 is a plot of signal attenuation versus control position for the crossfader control of FIG. 2.

FIGS. 7A–7C are a schematic diagram of an embodiment of the circuitry of FIG. 6.

DETAILED DESCRIPTION OF THE INVENTION

Figure 5A:
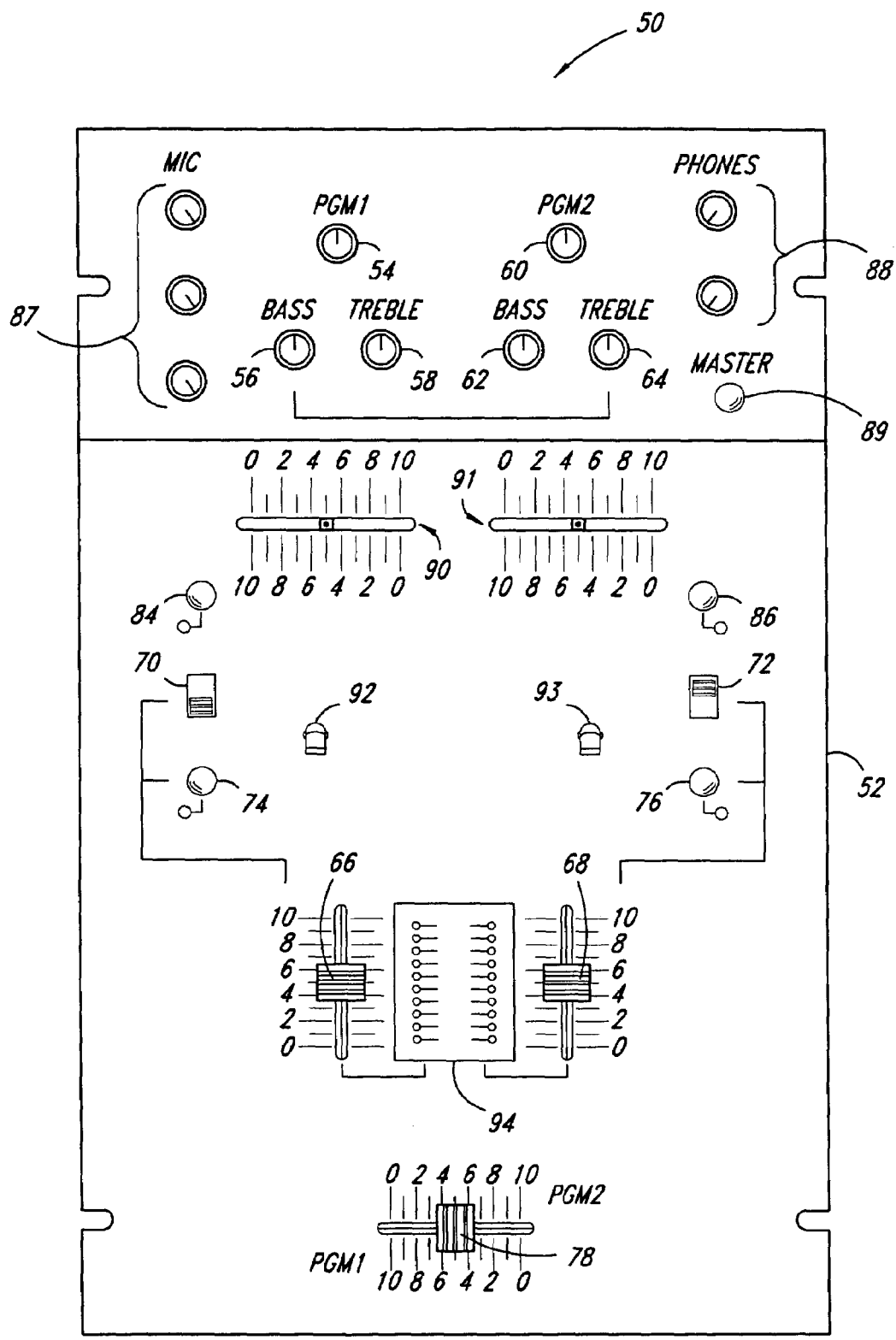
FIG. 5A shows the control panel for an embodiment of an audio mixer according to the invention.
Figure 5B:
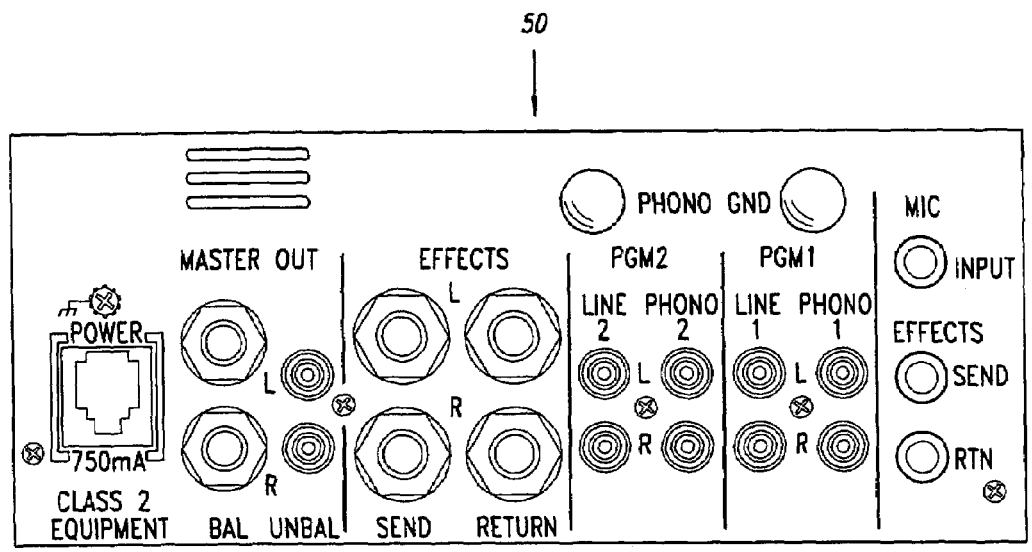
FIG. 5B shows the power and signal jacks on one side of the mixer of FIG. 5A.
Figure 5C:
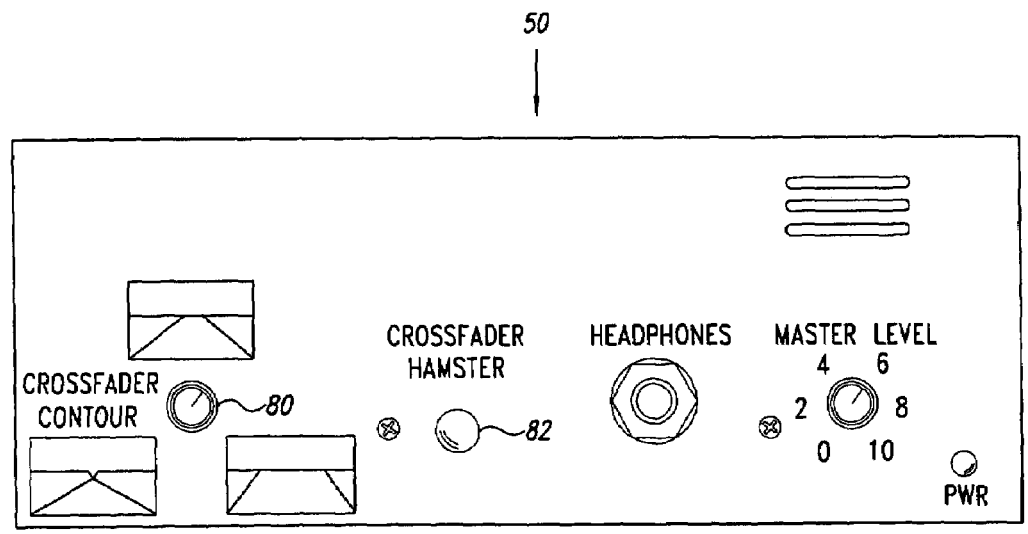
FIG. 5C shows the controls on another side of the mixer of FIG. 5A.
Figure 5D:
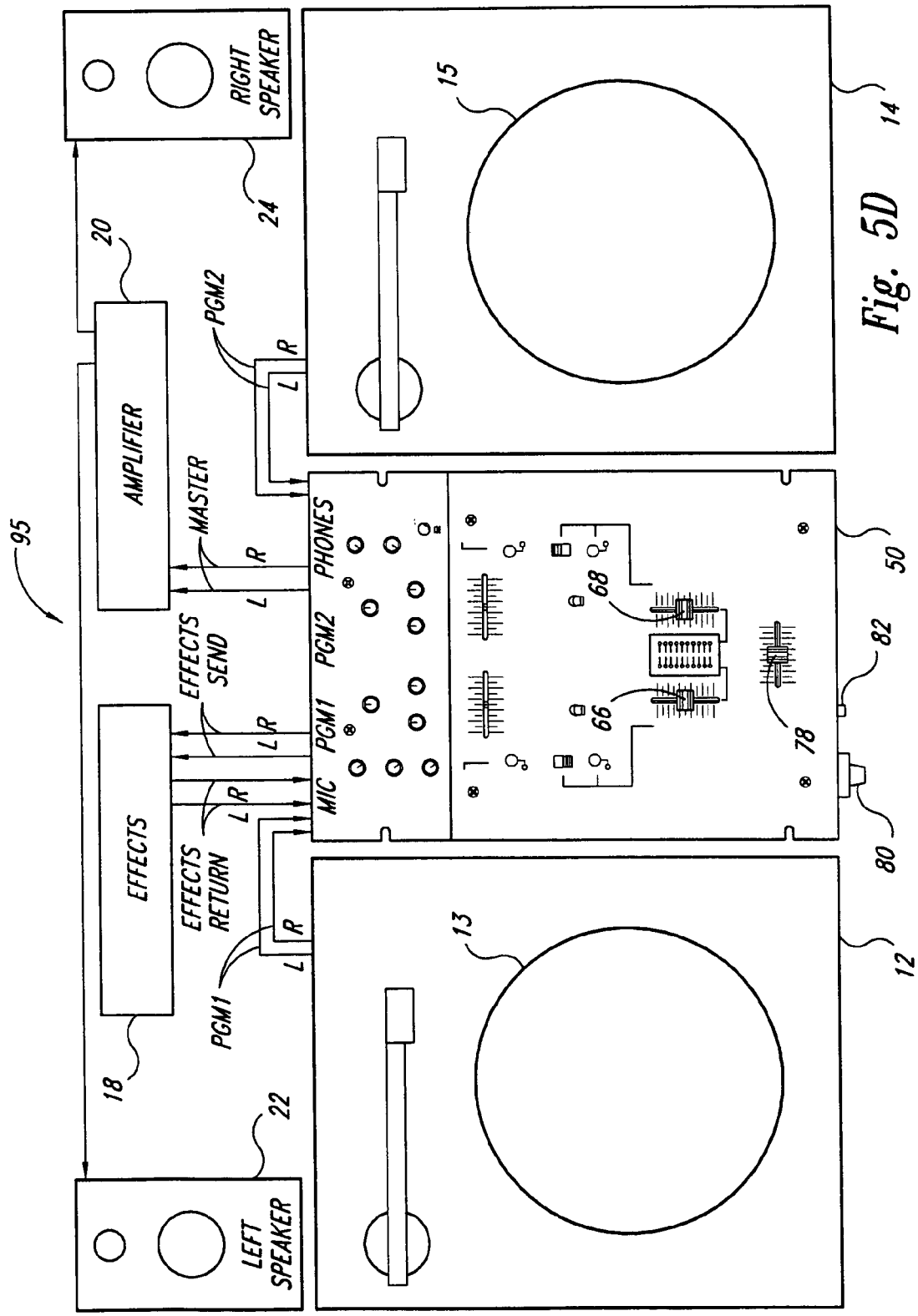
FIG. 5D is a block diagram of a sound system that incorporates the mixer of FIGS. 5A–C.

FIGS. 5A–C are respective views of an audio mixer according to an embodiment of the invention, and FIG. 5D is a block diagram of a sound system that incorporates the audio mixer of FIGS. 5A–C.

FIG. 5A is a top view of a mixer 50 according to an embodiment of the invention. For example, the mixer 50 may be a TTM 54 Performance Mixer manufactured by RANE Corporation of Mukilteo, Wash. The mixer 50 includes a control panel 52, which includes an all-band gain control 54 and bass-band and treble-band gain controls 56 and 58 for the PGM1 signal, and which includes an all-band gain control 60 and bass-band and treble-band gain controls 62 and 64 for the PGM2 signal. The all-band gain controls 54 and 60 function like the controls 28 and 30, respectively, of FIG. 2. The bass-band and treble-band gain controls 56, 58, 62, and 64 function like the controls 32, 36, 34, and 38, respectively, of FIG. 2, but the tone-control circuits of the mixer 50 (not shown in FIG. 5A) are significantly improved over the prior-art tone-control circuits as discussed below in conjunction with FIGS. 16–24.

The mixer 50 also includes respective PGM1 and PGM2 input-fader controls 66 and 68, respective PGM1 and PGM2 input-fader contour controls 70 and 72, and respective PGM1 and PGM2 input-fader reversal controls, i.e., "hamsters", 74 and 76. The fader controls 66 and 68 function like the controls 40 and 42 of FIG. 2 and the contour and reversal controls function like the contour and reversal controls described in the Background of the Invention. But the input-fader circuits of the mixer 50—which incorporate the input-fader, contour, and reversal controls 66, 68, 70, 72, 74 and 76 and which are discussed below in conjunction with FIGS. 8–9—are significantly improved over the prior-art input-fader circuits.

Additionally, the mixer 50 includes a crossfader control 78, crossfader contour control 80 (FIG. 5C), and crossfader reversal control 82 (FIG. 5C), which respectively function like the crossfader control 44 and the crossfader contour and reversal controls discussed in the Background. But the crossfader circuit of the mixer 50—which incorporates the crossfader, contour, and reversal controls 78, 80, and 82 and which is discussed below in conjunction with FIGS. 10–13—is significantly improved over the prior-art crossfader circuits.

Furthermore, the mixer 50 includes assignable-effects controls 84 and 86, which, depending upon their respective settings, route one of the PGM1, PGM2, or MASTER signals through the effects box 18 (FIG. 5D).

The mixer 50 may also include conventional microphone controls 87, conventional headphone controls 88, a conventional master/cue control 89, conventional PGM1 and PGM2 balance controls 90 and 91, conventional PGM1 and PGM2 phone/line switches 92 and 93, and a conventional LED volume display 94.

Thus, unlike prior-art mixers like the mixer 16 of FIG. 2, the mixer 50 includes input-fader contour and input-fader reversal controls and crossfader contour and crossfader reversal controls. The mixer 50 also allows a turntablist to route PGM1, PGM2, or MASTER through the effects box 18 (FIG. 5D) without having to physically disconnect and reconnect the box 18. Additionally, the mixer 50 provides many other improvements as described below.

FIG. 5B is a side view that shows the signal and power jacks of the mixer 50. Because it can mix and generate both monaural and stereo audio signals, the mixer 50 has two connectors, a left (L) connector and a right (R) connector, for each potential source (line or phono) of the PGM1 and PGM2 signals and each potential termination (balanced or unbalanced) of the MASTER signal. For monaural operation, either the L connectors or the R connectors may be used. The phono connectors allow the mixer 50 to receive PGM1 and PGM2 from turntables like the turntables 12 and 14 (FIG. 5D), and the line connectors allow the mixer 50 to receive PGM1 and PGM2 from other sources such as a radio receiver, compact disc (CD) player, or tape player. Furthermore, unlike prior-art mixers, the mixer 50 includes both send and return connectors for the effects box 18 (FIG. 5D) so that the controls 84 and 86 can route one of the PGM1, PGM2, and MASTER signals to the effects box 18 via the send connectors and can receive the signal, which has added audio effects, from the effects box 18 via the return connectors. The mixer 50 also includes a conventional microphone input connector and microphone-effects send and return connectors, which allow the mixer 50 to send the microphone signal to a microphone effects box (not shown) and to receive therefrom the microphone signal having added audio effects.

FIG. 5C is another side view of the mixer 50 that shows the crossfader contour and reversal controls 80 and 82, which are discussed above in conjunction with FIG. 5A, a conventional all-band volume-level control for the MASTER signal, and a conventional headphone connector.

Figure 1:
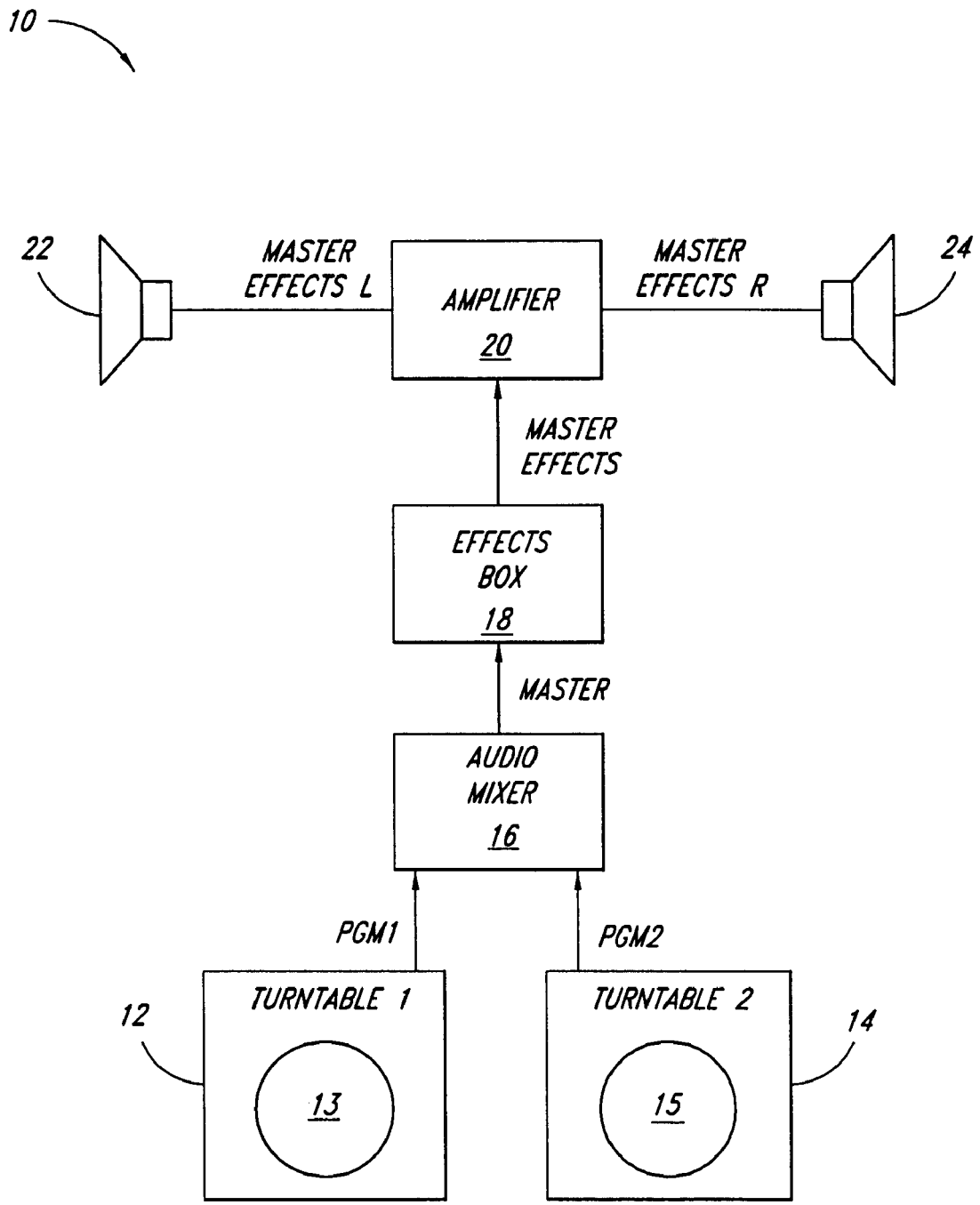
FIG. 1 is a block diagram of a turntablist's sound system according to the prior art.

FIG. 5D is a block diagram of a sound system 95, which incorporates the mixer 50 of FIGS. 5A–5C and which has like numerals for like elements with respect to FIGS. 1 and 5A. The sound system 95 is similar to the sound system 10 of FIG. 1 except that the mixer 50 replaces the prior-art mixer 16 and the effects box 18 has both its input and output terminals coupled to the mixer 50 as discussed above in conjunction with FIG. 5B. As discussed below, the mixer 50 incorporates improvements that make it superior to the prior-art mixer 16, and thus make the sound system 95 superior to the sound system 10.

Figure 6:
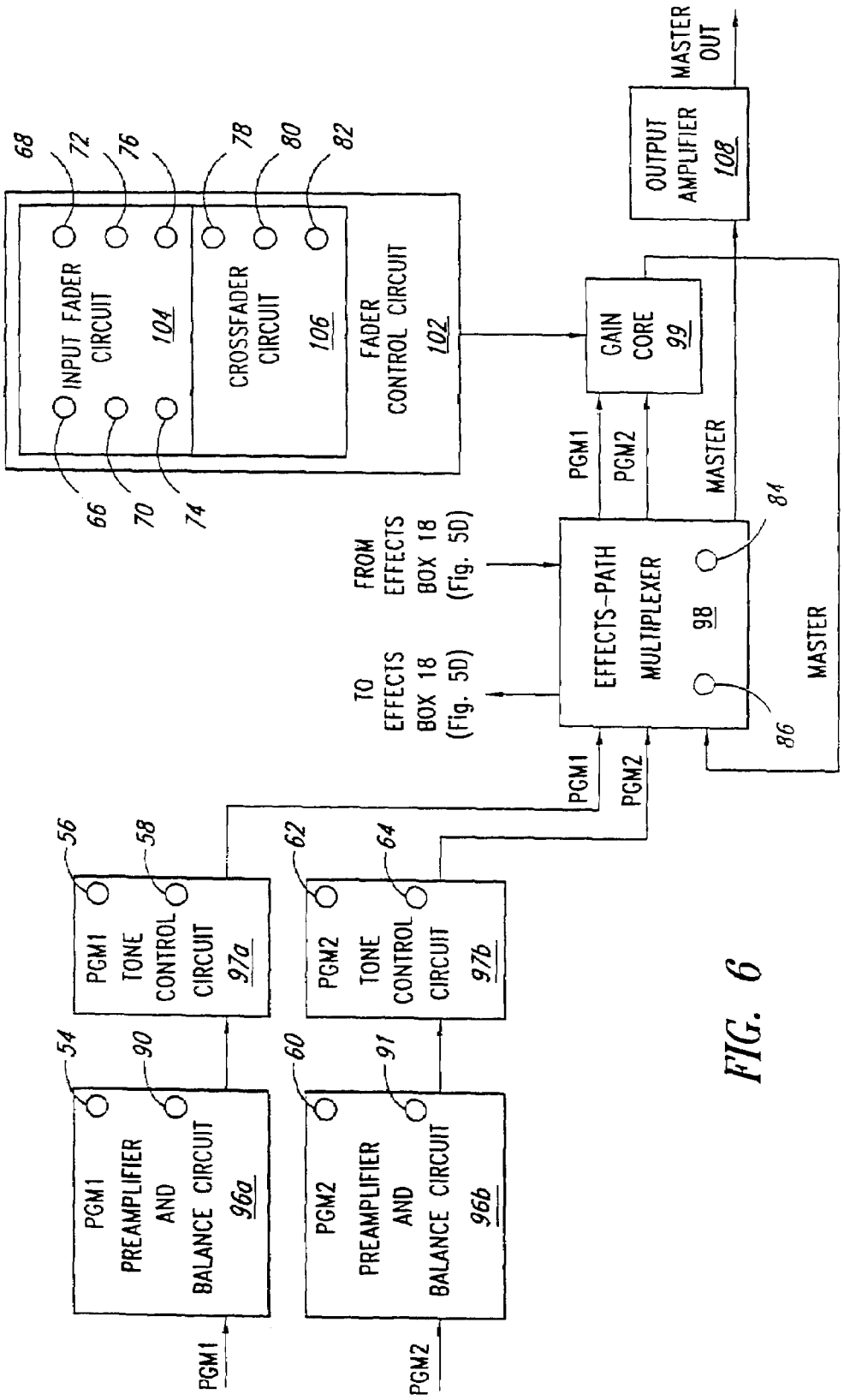
FIG. 6 is a schematic block diagram of the circuitry for an embodiment of the mixer of FIGS. 5A–C.

FIG. 6 is a block diagram of the circuitry for an embodiment of the mixer 50 of FIGS. 5A–D, where like numerals are used for like elements with respect to FIGS. 5A–D and where circuits not pertinent to the invention are omitted for clarity.

The mixer 50 includes conventional PGM1 and PGM2 preamplifier and balance circuits 96a and 96b, which respectively include the gain and balance controls 54 and 90 and 60 and 91 and which respectively adjust the gains and balances of PGM1 and PGM2 in response thereto. Tone-control circuits 97a and 97b are respectively coupled to the circuits 96a and 96b, respectively include the bass and treble controls 56 and 58 and 62 and 64, and adjust the bass-band and treble-band gains of PGM1 and PGM2, respectively, based on the settings of these controls. In one embodiment, the circuits 97a and 97b also include respective controls for adjusting the mid-band gains of PGM1 and PGM2 as discussed above in conjunction with FIGS. 16–24. In another embodiment, the circuits 97a and 97b provide steep frequency-cutoff slopes, and thus allow independent control of the bass-, mid-, and treble-band gains, with fewer components than prior-art tone-control circuits.

The mixer 50 also includes an effects-path multiplexer 98, which includes the assignable-effects controls 84 and 86. The multiplexer 98 receives PGM1 and PGM2 from the tone-control circuits 97a and 97b, respectively, and receives the MASTER signal from a gain core 99. Depending upon the settings of the controls 84 and 86, the multiplexer 98 couples one or none of the PGM1, PGM2, or MASTER signals through an effects path that includes the effects box 18 (FIG. 5D). If the multiplexer 98 does couple one of these signals through the effects path, it receives the return signal—which has audio effects added—from the effects box 18, and then provides the return signal to the respective one of the PGM1, PGM2, and MASTER output terminals. Conversely, the multiplexer 98 merely passes through, from input to output, the signals that it does not route through the effects path.

The gain core 99 amplifies PGM1 and PGM2 from the multiplexer 98 in response to one or more gain-control signals that are generated by a fader control circuit 102, which includes an input-fader circuit 104 and a crossfader circuit 106. The input-fader circuit 104 includes the input-fader, contour, and reversal controls 66, 70, and 74 for adjusting PGM1 and includes the input-fader, contour, and reversal controls 68, 72, and 76 for adjusting PGM2. Likewise, the crossfader circuit includes the crossfader, contour, and reversal controls 78, 80, and 82. After amplifying PGM1 and PGM2, the gain core 99 mixes these signals together to generate the MASTER signal, which the gain core 99 provides to an input of the effects-path multiplexer 98 as discussed above.

An output amplifier 108 amplifies the MASTER signal from the multiplexer 98 and provides the amplified MASTER signal to the MASTER connector(s) of FIG. 5B.

In operation, before playing his piece, a turntablist adjusts the controls, e.g., 54 and 90 and 60 and 91, of the circuits 96a and 96b to give the desired amounts of gain and balance to PGM1 and PGM2, respectively. He also adjusts the controls, e.g., 56 and 58 and 62 and 64, of the tone-control circuits 97a and 97b to provide the desired gain or cut in the bass, mid, and treble-bands of PGM1 and PGM2, and if he desires audio effects, he adjusts the controls, e.g., 84 and 86, of the multiplexer 98 to route one of the signals PGM1, PGM2, and MASTER through the effects path. Additionally, the turntablist adjusts the input-fader and crossfader contour controls 70, 72, and 80 and reversal controls 74, 76, and 82 to the desired settings. Although the turntablist typically adjusts the above controls before performing his piece, he may adjust them while playing his piece as well. Then, while playing his piece, the turntablist manipulates the input-fader controls 66 and 68 and the crossfader control 78. As they move, the controls 66, 68, and 78 vary the gains that the core 99 imparts to PGM1 and PGM2 before it mixes them together. These gain variations cause the changes in the volumes and mixing ratio of PGM1 and PGM2 that give the desired musical effects. The output amplifier 108 amplifies the MASTER signal and provides it to the house amplifier 20 (FIG. 5D) so that the audience can hear the turntablist's musical piece.

Figure 7A:
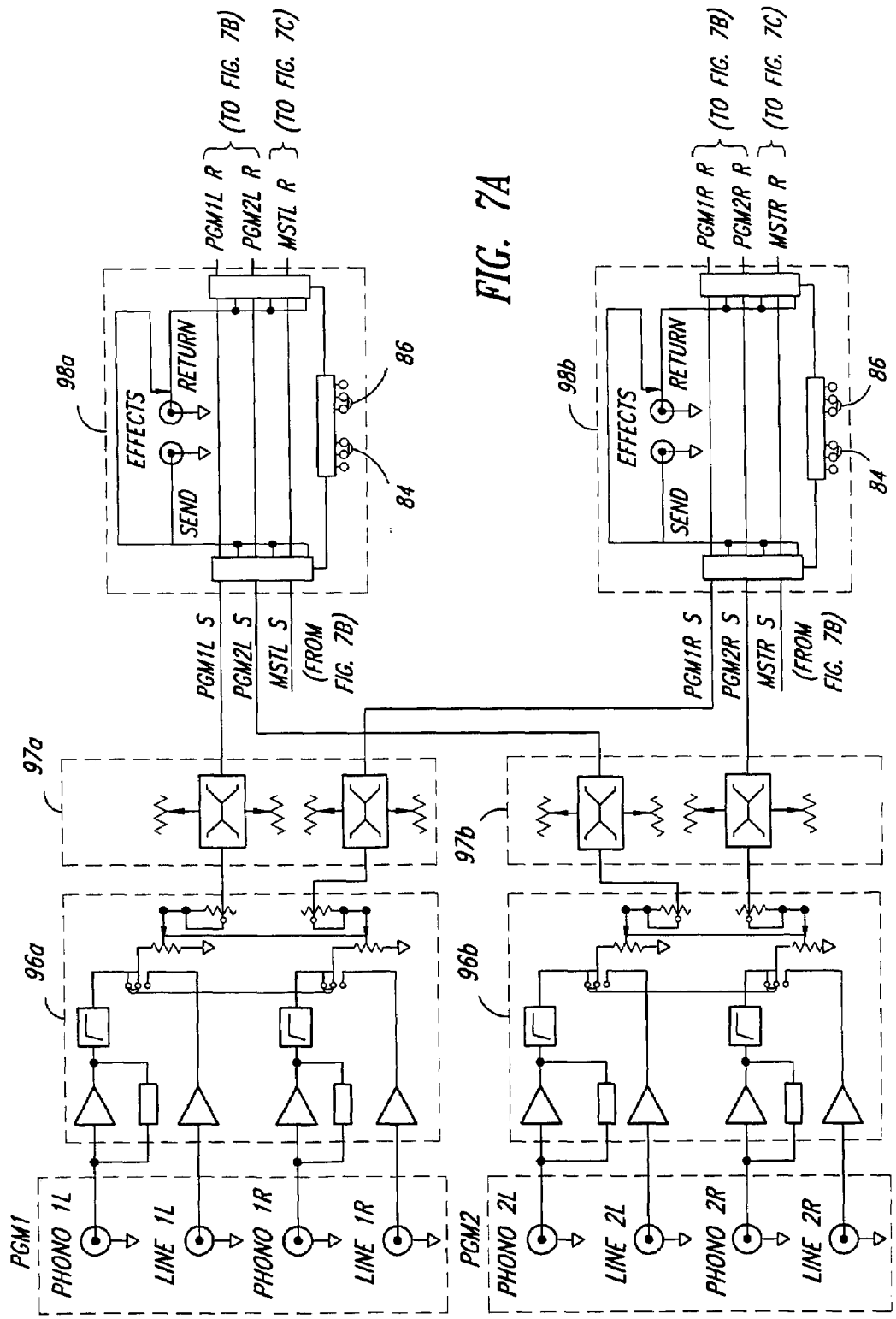

FIGS. 7A–7C are a schematic diagram of an embodiment of the mixer circuitry of FIG. 6. Unlike FIG. 6, FIG. 7 shows the L and R components of PGM1, PGM2, and MASTER. Furthermore, FIG. 7 shows the portions 98a and 98b of the effects-path multiplexer 98 for processing the L and R components, respectively, of PGM1, PGM2, and MASTER.

Input-Fader Circuit

Figure 8:
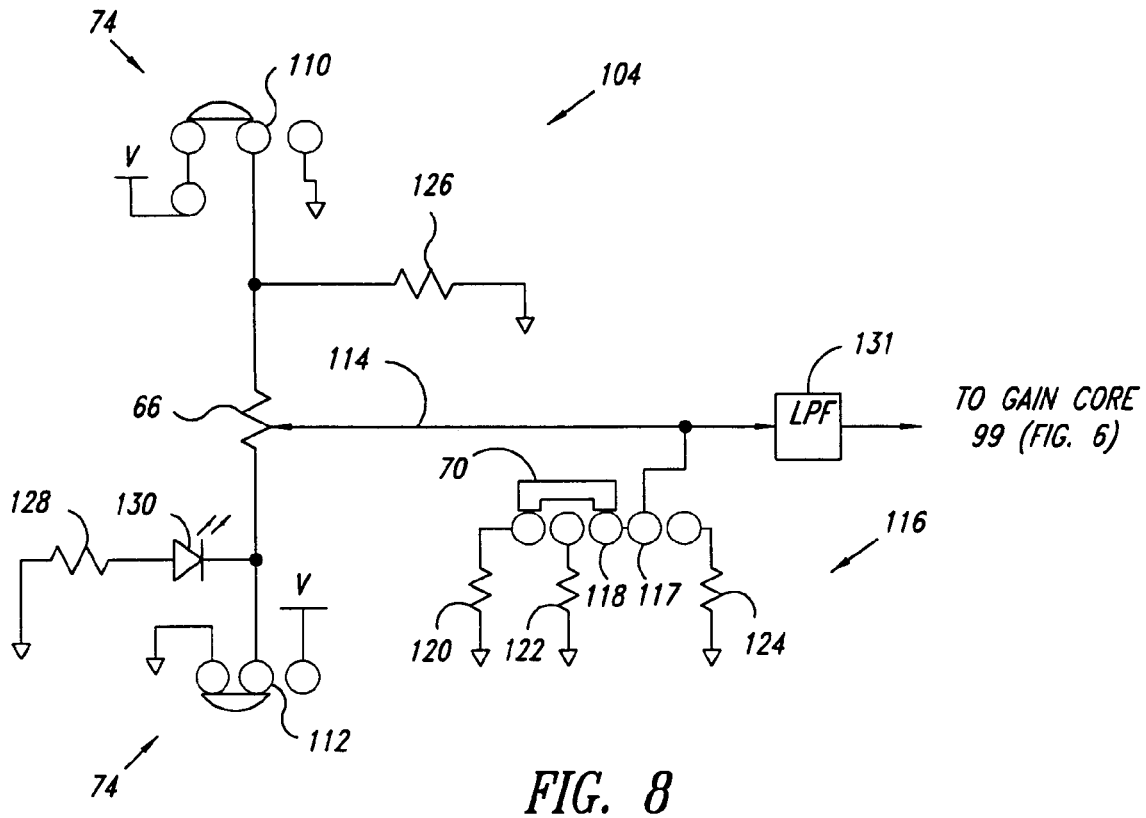
FIG. 8 is a schematic diagram of an embodiment of the input-fader circuit of FIG. 6.

FIG. 8 is a schematic diagram of a portion of the input-fader circuit 104 of FIG. 6 according to an embodiment of the invention. For clarity, only the portion that controls the volume of PGM1 is shown, the portion that controls the volume of PGM2 being similar.

The circuit 104 includes the input-fader control 66, the contour control 70, and the reversal control 74, which in this embodiment are a potentiometer, a three-position switch, and a two-position switch, respectively.

The reversal control 74 reverses the full-volume and cut-volume positions of the control 66 by reversing the voltage polarity across it. Specifically, the unmovable terminals of the control 66 are respectively coupled to terminals 110 and 112 of the reversal control 74. In the illustrated position, the control 74 couples the terminals 110 and 112 to a voltage V and ground, respectively, and in its other position, the control 74 couples the terminals 110 and 112 to ground and V respectively.

The control 66 includes a wiper arm 114, which is what moves when the turntablist moves the control 66. The arm 114 divides the control 66 into two resistors having respective values that depend on the position of the arm 114. Thus, based on the well-known voltage-divider principle, the voltage at the arm 114 depends on a ratio of the values of these two resistors. For example, if the arm 114 is in the middle position, the two resistors are equal and the voltage at the arm 114 is V/2. The control 66 provides this voltage, which is called an input-fader gain-control voltage, to the gain core 99 (FIG. 6) to control the gain of the PGM1 amplifier therein. Because this gain-control voltage, and thus the gain of the PGM1 amplifier, depends more on the ratio of the resistor values than on the actual resistor values, the control 66 is called a ratiometric control, which significantly reduces the component-tolerance sensitivity of the circuit 104. Thus, the respective position-attenuation characteristics of the controls 66 are significantly more repeatable from mixer to mixer than the position-attenuation characteristics of the controls 40 and 42 of FIG. 2.

The contour control 70 is part of a contour circuit 116, which adds a load to the wiper arm 114 to vary the shape of the position-versus-attenuation curve (FIG. 9) of the control 66. Specifically, the arm 114 is coupled to terminals 117 and 118 of the control 70, which depending upon its setting, couples the arm 114 to a respective one of different-sized contour resistors 120, 122, and 124. As discussed further below in conjunction with FIG. 9, each contour resistor presents a different load to the arm 114 and thus causes the position-versus-attenuation curve to have a different shape.

The circuit 104 also includes resistors 126 and 128 and a light-emitting diode (LED) 130. The LED 130 turns on if the reversal switch 74 is in the reverse position (the position opposite that shown in FIG. 8). The resistor 128 limits the current through the LED 130. Because the source (not shown) that generates V may have a relatively high output impedance, the resistor 126 is included to balance the load "seen" by the source so that V remains relatively constant regardless of the position of the switch 74.

In operation while performing his piece, the turntablist moves the control 66 such that the gain-control voltage has a value between V and ground. In one embodiment, full gain, and thus full volume, correspond to the gain-control voltage equaling ground, and minimum gain, and thus volume cutoff, correspond to the gain-control voltage equaling V. Before or while performing his piece, the turntablist may switch the reversal control 74 to reverse the full and cut positions of the control 66, and may switch the contour control 70 to change the slope of the attenuation-versus-position curve of the control 66.

In one embodiment of the input-fader circuit 104, the cutoff level of the gain-control signal is sufficient to prevent PGM1 from bleeding into the MASTER signal. In another embodiment, V=−3.2 Volts. In yet another embodiment, the resistors 120, 122, 124, 126, and 128 have the following respective values: 7.5 kΩ, 37.4 kΩ, 90.9 kΩ, 1 kΩ and 243 Ω, and the control 66 has a value of 200 kΩ. In still another embodiment, the control 66 is removable to allow field replacement because it may wear out several times during the lifetime of the mixer 50. In yet another embodiment that is discussed below in conjunction with FIG. 14, an optional low-pass filter 131 is included between the arm 114 and the gain core 99 (FIG. 6) to reduce travel noise caused by the movement of the control 66. The filter 131 typically has a corner frequency in the range of approximately 10–50 Hz. A corner frequency of approximately 45 Hz has been found to provide good noise reduction without noticeably slowing the response time of the control 66. In still another embodiment, the control 66 is an optical control that generates an optical digital signal proportional to its position, and the circuit 104 includes circuitry for processing this digital signal and generating the gain-control signal therefrom. In yet another embodiment, the contour circuit 116 provides more or fewer then three discrete contour settings. In still another embodiment, the switch 70 and the resistors 120, 122, and 124 of the contour circuit 116 are replaced with a potentiometer such that the circuit 116 provides a continuous range of contour settings.

Therefore, in addition to the previously mentioned advantages, unlike the designs of many prior-art fader circuits, the design of the circuit 104 allows it to have both a reversal control and a contour control. Furthermore, in the cutoff position, the circuit 104 can reduce the gain of the PGM1 amplifier in the gain core 99 (FIG. 6) enough to prevent bleed through of PGM1 into the MASTER signal. Additionally, the circuit 104 reduces or eliminates cross-talk between PGM1 and PGM2.

Figure 9:
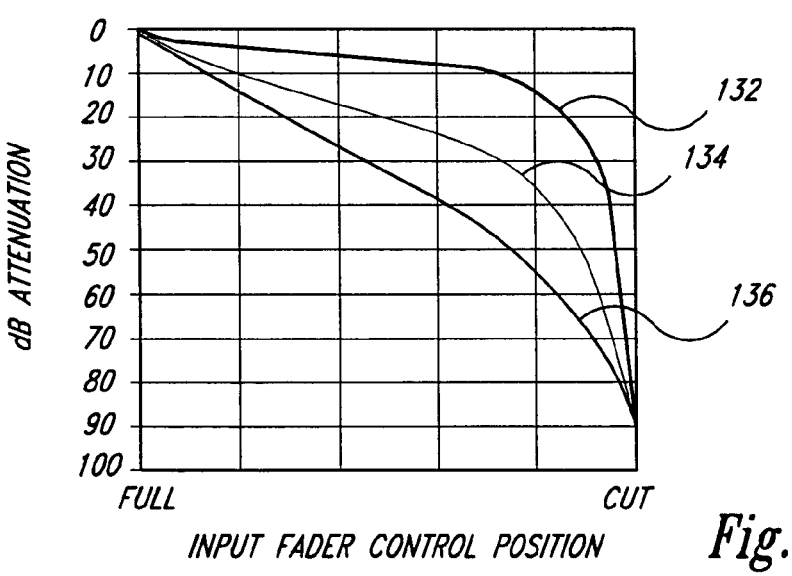
FIG. 9 is a plot of signal attenuation versus control position for the different contour settings of the input-fader circuit of FIG. 8.

FIG. 9 is a plot of three curves 132, 134, and 136, which show the attenuation of PGM1 caused by the gain-control signal versus the position of the control 66 for the three settings of the contour control 70 of FIG. 8. These curves represent the embodiment of the contour control circuit 116 in which the resistors 120, 122, and 124 have the values given above. Because of the design of the circuit 116, these curves do not have constant slopes, i.e., are not straight lines. The curve 132 corresponds to the control 70 coupling the smallest resistor, here the 7.5 kΩ resistor 120, to the wiper 114. The curve 132 has the most gradual slope until the control 66 is almost at the cutoff position, at which point the curve 132 has a very steep slope that is suitable for switching between cutoff and nearly full volume with a relatively small movement of the control 66. The curve 134 corresponds to the control 70 coupling the middle-valued resistor, here the 37.4 kΩ resistor 122, to the wiper 114. The curve 134 generally has a steeper slope than the curve 132 until the control 66 is almost at cutoff, at which point the curve 134 has a more gradual slope than the curve 132. The curve 136 has a nearly constant slope, and corresponds to the control 70 coupling the largest resistor, here the 90.9 kΩ resistor 124, to the wiper 114. By changing the values of the resistors 120, 122, and 124, one can change the shapes of the curves 132, 134, and 136, respectively. Furthermore, in another embodiment, the circuit 116 is designed to provide the curves 132, 134, and 136 having different shapes such as straight lines or nearly straight lines having different slopes.

Crossfader Circuit

Figure 10:
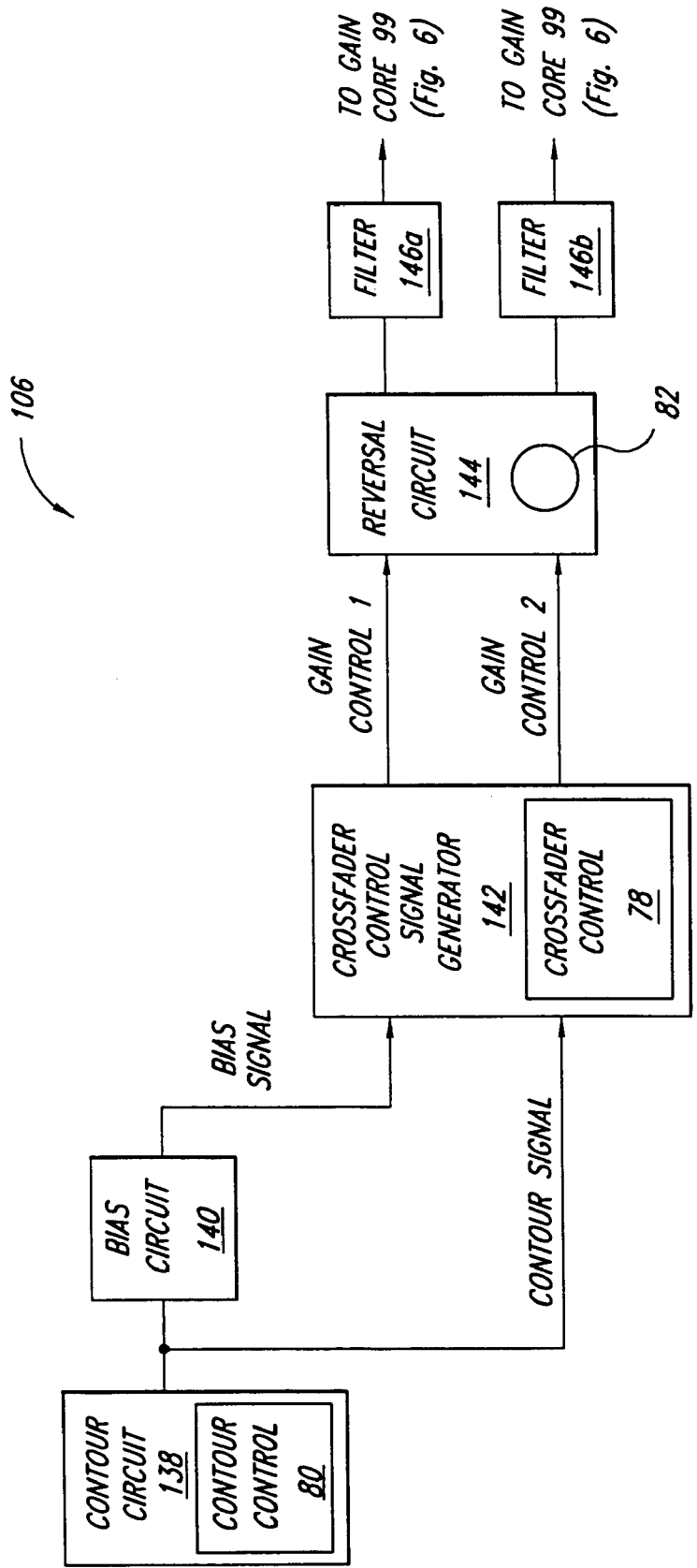
FIG. 10 is a block diagram of an embodiment of the crossfader circuit of FIG. 6.

FIG. 10 is a block diagram of an embodiment of the crossfader circuit 106 of FIG. 6. The circuit 106 includes a crossfader contour circuit 138, which includes the contour control 80 and which generates a contour signal in response to the setting of the control 80. A bias circuit 140 generates a bias signal from the sum of a reference signal and a contour signal. A crossfader-control-signal generator 142 includes the crossfader control 78 and generates first and second gain-control signals. The respective values of the first and second gain-control signals depend on the position of the control 78 and the values of the contour and bias signals. A reversal circuit 144, which includes the reversal control 82, receives the first and second gain-control signals. Depending on the setting of the reversal control 82, the circuit 144 provides the first and second gain-control signals to control the respective gains of the PGM1 and PGM2 amplifiers of the gain core 99 (FIG. 6) or vice versa. As discussed above in conjunction with FIG. 8 and further below in conjunction with FIG. 14, the crossfader circuit 106 may also include low-pass filters 146a and 146b to limit the frequency response of the control 78 so as to reduce audible travel noise when the turntablist moves the control 78 without reducing the response time of the control 78 below acceptable levels. In one embodiment, the filters 146a and 146b have respective corner frequencies in the range of approximately 10–50 Hz, for example approximately 45 Hz.

In operation, the turntablist adjusts the contour control 80 as desired. The contour signal from the contour circuit 138 sets the slope of the attenuation-versus-position curves (FIGS. 11A–11C) of the first and second gain-control signals. In one embodiment, the bias signal has a value such that at the respective full-volume positions of the control 78, the circuit 142 generates the first and second gain-control signals such that the PGM1 and PGM2 amplifiers of the gain core 99 (FIG. 6) have a maximum gain of one. The turntablist also adjusts the reversal control 82 to set the PGM1 and PGM2 full/cut positions of the control 78, and moves the control 78 while playing his piece to vary the values of the first and second gain-control signals. Thus, by varying the values of these gain-control signals, the turntablist varies the volume ratio of PGM1 and PGM2 in the MASTER signal.

Figure 11A:
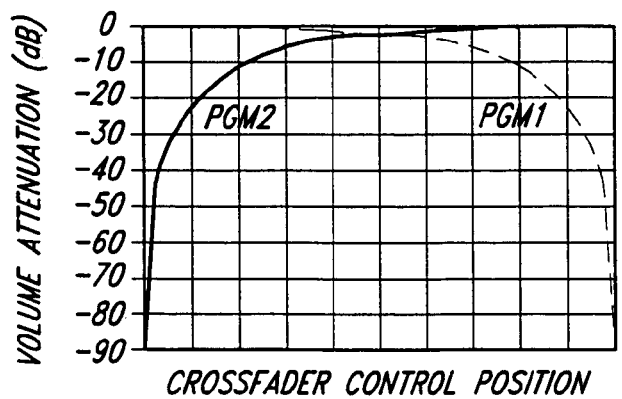
FIG. 11A is a plot of signal attenuation versus control position for a first setting of the contour control of the crossfader circuit of FIG. 10.

FIG. 11A is a plot of two curves that respectively show PGM1 and PGM2 attenuation versus control 78 position for one setting of the contour control 80 of FIG. 10. That is, one curve shows the attenuation of PGM1 caused by the corresponding gain-control signal, and the other shows the attenuation of PGM2 caused by the other gain-control signal. At this contour-control setting, the sum of the powers of PGM1 and PGM2 is nearly or exactly constant as discussed above in conjunction with FIG. 4. Thus, the volume of MASTER is nearly or exactly constant regardless of the position of the crossfader control 78. In one embodiment, the maximum deviation from constant power is ±0.5 dB. Furthermore, the achievement of constant power is based on an assumption that PGM1 and PGM2 include equal or nearly equal root-mean-square (RMS) levels of incoherent signals. Thus, if PGM1 and PGM2 migrate from this condition, the maximum deviation from constant power may increase.

Figure 11B:
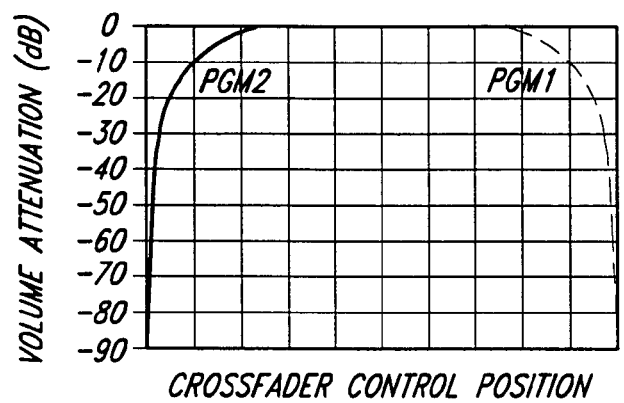
FIG. 11B is a plot of signal attenuation versus control position for a second setting of the contour control of the crossfader circuit of FIG. 10.

FIG. 11B is a plot of two curves that respectively show PGM1 and PGM2 attenuation versus control 78 position for another setting of the contour control 80 of FIG. 10. At this contour setting, the slopes of the curves are relatively steep such that a relatively small movement of the crossfader control 78—approximately 20% of full range—near its full/cut positions transitions the respective PGM1 and PGM2 signals between cutoff and full volume. At and around the middle position of the control 78, the mixing ratio of PGM1 to PGM2 equals 1:1.

Figure 11C:
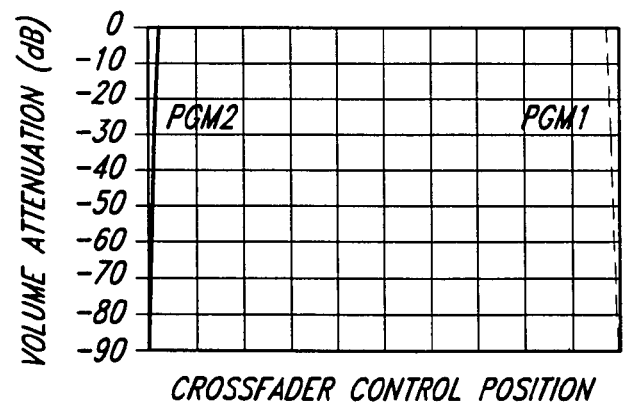
FIG. 11C is a plot of signal attenuation versus control position for a third setting of the contour control of the crossfader circuit of FIG. 10.

FIG. 11C is a plot of two curves that respectively show PGM1 and PGM2 attenuation versus control 78 position for yet another setting of the contour control 80 of FIG. 10. At this contour setting, the slope of the curves are even steeper than slopes of the curves in FIG. 11B, so that an even smaller movement of the crossfader control 78—approximately 3% of full range, which is approximately 2 millimeters in one embodiment—near its full/cut positions transitions the respective PGM1 and PGM2 signals between cutoff and full volume.

Thus, the crossfader circuit 106 of FIG. 10 includes both a contour circuit 138 and a reversal circuit 144. Additionally, the contour circuit 138 allows the attenuation-versus-position curves to have contours ranging from constant power (FIG. 11A) to fast cut-in/cut-out (FIG. 11C). Furthermore, the circuit 106 generates the first and second gain-control signals such that at the full-cut positions of the control 78, the gain-control signals prevent bleed through of PGM1 or PGM2, respectively, into MASTER.

Figure 12:
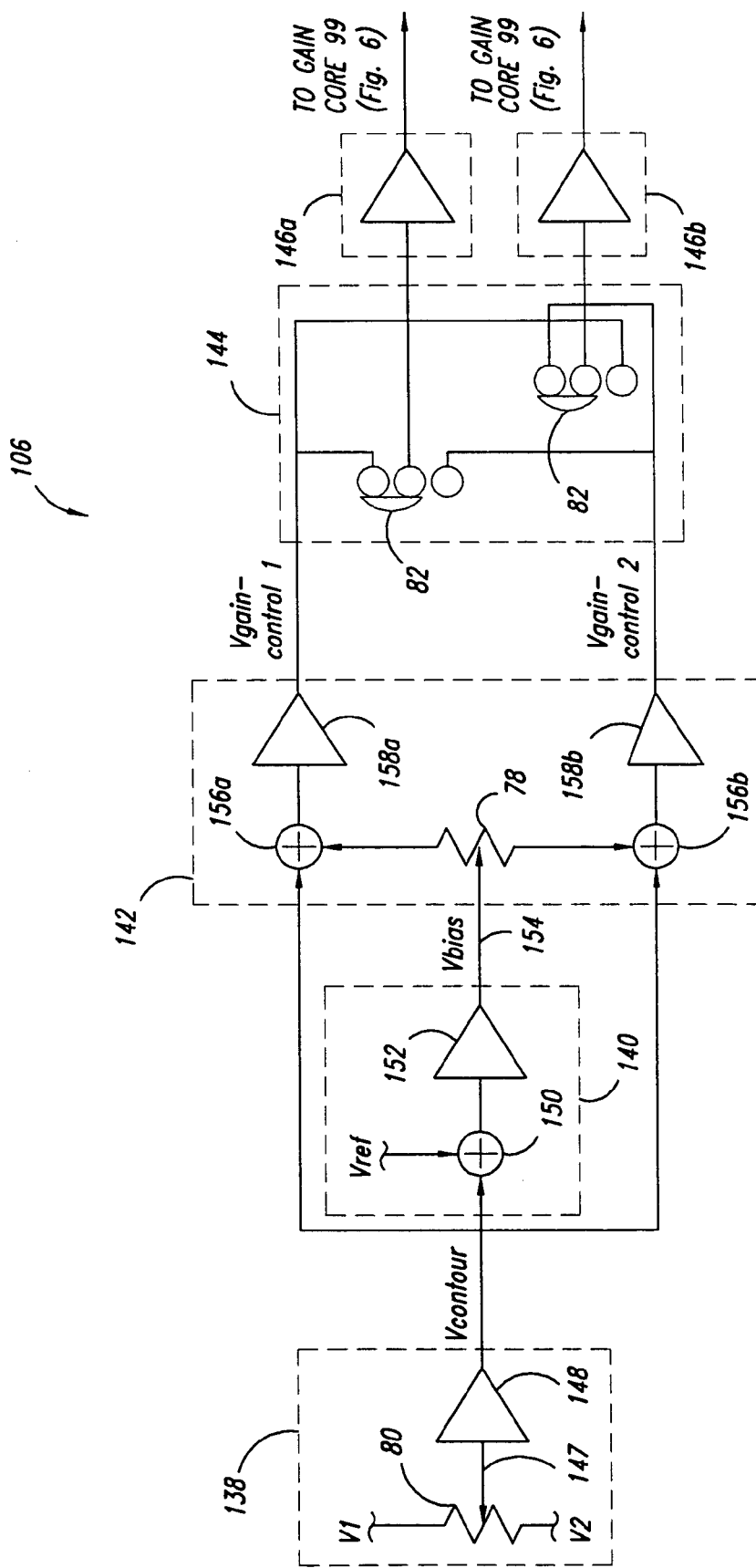
FIG. 12 is a schematic block diagram of an embodiment of the crossfader circuit of FIG. 10.

FIG. 12 is a schematic block diagram of an embodiment of the crossfader circuit 106 of FIG. 10.

In this embodiment, the contour control 80 is a ratiometric control that includes a potentiometer having its two stationary terminals coupled between voltages V1 and V2. The control 80 generates a contour voltage Vcontour on its wiper arm 147, which is coupled to the input terminal of an amplifier 148. The bias circuit 140 includes a signal combiner 150, which combines Vcontour from the circuit 138 with a reference voltage Vref. The circuit 140 also includes an amplifier 152, which generates a bias signal Vbias from the combiner 150 output signal. In this embodiment, the combiner 150 is a summer circuit.

The crossfader control 78 is also a ratiometric control that includes a potentiometer having a wiper arm 154 coupled to receive Vbias from the bias circuit 140. (It is the wiper arm 154 that moves when the turntablist moves the control 78.) The control 78 generates respective portions of Vbias at its stationary terminals, the values of these respective portions depending on the position of the wiper arm 154. The larger the value of Vbias, the greater the change in the respective portions of Vbias at the stationary terminals of the control 78, and thus the greater the changes in the gain-control voltages Vgain-control1 and Vgain-control2. The crossfader-control-signal generator 142 includes signal combiners 156a and 156b, which are summer circuits in this embodiment and which combine Vcontour with the respective portions of Vbias generated by the control 78 at its stationary terminals. For example, suppose the arm 154 is in the upper full/cut position such that it is directly coupled to the combiner 156a. Thus, the full value of Vbias is coupled to the combiner 156a, and a partial value of Vbias (attenuated by the resistance of the control 78) is coupled to the combiner 156*b*. Amplifiers 158*a* and 158*b* generate respective first and second gain-control voltages Vgain-control1 and Vgain-control2 from the respective gain signals output from the combiner circuits 156*a* and 156*b*. The amplifiers 158*a* and 158*b* restrict Vgain-control1 and Vgain-control2 to one polarity, i.e., either positive (including 0) or negative (including 0). Thus, in one embodiment, Vgain-control1 and Vgain-control2 maintain the respective gains of the PGM1 and PGM2 amplifiers of the gain core 99 (FIG. 6) within a range of unity and below.

Still referring to FIG. 12, if the reversal control 82 is in the illustrated position, then the reversal circuit 144 couples Vgain-control1 and Vgain-control2 to the to the filter circuits 146*a* and 146*b*, respectively. Conversely, if the reversal control 82 is in the other position, then the reversal circuit 144 couples Vgain-control1 and Vgain-control2 to the filter circuits 146*b* and 146*a*, respectively.

Thus, the topology of the crossfader circuit 106 provides a lower sensitivity to changes in component values than prior crossfader circuits.

Although shown here as potentiometers, in another embodiment, the controls 78 and 80 are optical controls that generate optical digital signals and the circuits 138, 140, and 142 are digital circuits that process these digital signals to generate the first and second gain-control signals in a manner similar to that described above. Furthermore, although the contour, bias, and first and second gain-control signals are described as voltages, in other embodiments one or more of these signals may be currents. Additionally, although Vgain-control1 and Vgain-control2 are described as maintaining the respective gains of the PGM1 and PGM2 amplifiers of the gain core 99 within a range of unity gain and below, in other embodiments they may maintain the gains of these amplifiers within other ranges.

Figure 13:
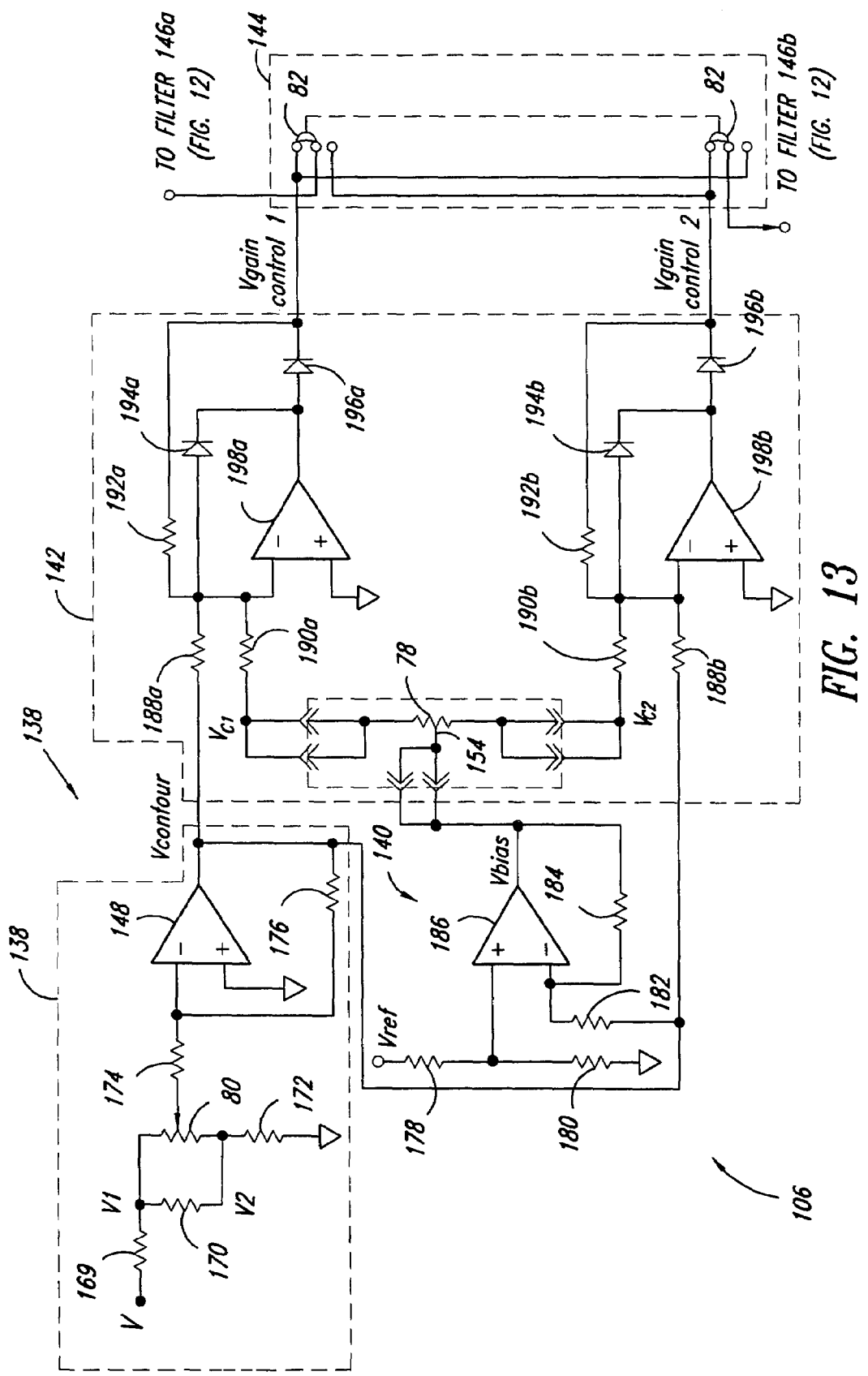
FIG. 13 is a schematic diagram of an embodiment of the crossfader circuit of FIG. 12.

FIG. 13 is a schematic diagram of an embodiment of the circuit 106 of FIG. 12. In this embodiment, in addition to the contour control 80 and the amplifier 148, the contour circuit 138 includes bias resistors 169, 170, and 172, an input resistor 174, and a feedback resistor 176. In one embodiment, the values of these resistors respectively equal: 23.7 kΩ, 8.45 kΩ, 200 Ω, 200 kΩ, and 200 kΩ, the control 80 is a 100 kΩ potentiometer, and V is −15V. The bias circuit 140 includes bias resistors 178 and 180, an input resistor 182, a feedback resistor 184, and an amplifier 186, which acts as both the combiner 150 and amplifier 152 of FIG. 12. In one embodiment, the values of these resistors respectively equal 26.7 kΩ, 3.16 kΩ, 200 kΩ, and 200 kΩ, and Vref is −15V. The crossfader control circuit 142 includes a potentiometer for the crossfader control 78, input resistors 188*a*, 188*b*, 190*a*, and 190*b*, feedback resistors 192*a* and 192*b*, feedback diodes 194*a*, 194*b*, 196*a*, and 196*b*, and amplifiers 198*a* and 198*b*, which act as both the combiner circuits 156*a* and 156*b* and the amplifiers 158*a* and 158*b*, respectively, of FIG. 12. In one embodiment, the values of all these resistors equal 6.34 kΩ, and the value of the crossfader potentiometer is 200 kΩ. In such an embodiment, the amplifiers 198*a* and 198*b* each have a gain of −1, and thus the maximum value of Vgain-control1 and Vgain-control2 is −[Vbias+Vcontour]. Furthermore, the crossfader control 78 may be field replaceable.

In operation, because the amplifier 148 is connected in an inverting configuration and V1 and V2 are negative, the contour circuit 138 generates a positive voltage for Vcontour, the exact value of Vcontour depending on the setting of the control 80. In one embodiment where the amplifier 148 has unity gain, Vcontour is within a range of 94 millivolts (mV) to 3.67V.

The bias circuit 140 generates Vbias according to the following equation:

$$Vbias = \left[-Vcontour\frac{R184}{R182} + Vref\frac{R180}{R178+R180}\left(1+\frac{R184}{R182}\right)\right] \quad (1)$$

Because Vcontour is subtracted from Vbias and added to Vgain-control1, it is possible for the value of Vcontour to affect the response of the crossfader control 78 while the crossfader circuit 106 maintains a constant, maximum attenuation level. In addition, limiting the value of Vgain-control1 to non-negative values prevents Vcontour from affecting the maximum gain. Thus, Vcontour affects only the response of the crossfader control 78 and not the maximum gain or attenuation provided by the circuit 106.

The crossfader control circuit 142 generates Vgain-control1 as a combination of Vcontour and the portion of Vbias provided by the crossfader control 78. Specifically, because Vcontour is positive, the amplifier 148 sources a current into the input resistor 188*a* and thus tends to lower the output voltage of the amplifier 198*a*. Conversely, because Vbias is negative, the portion of Vbias generated by the control 78 is also negative. Thus, the control 78 sources a current into the input resistor 190*a* and thus tends to raise the output voltage of the amplifier 198*a*.

In the embodiment where the resistors 188*a*, 190*a*, and 192*a* equal the same value, if the absolute value of Vcontour is greater than the absolute value of the portion of Vbias provided by the control 78, then Vgain-control1 equals and is limited to a 0 V minimum. In one embodiment, Vgain-control1=0 V causes the PGM1 amplifier in the gain core 99 (FIG. 6) to have a maximum gain of 1, which corresponds to the 0 dB (maximum gain) level of the curves in FIGS. 11A–11C. More specifically, if the absolute value of Vcontour is greater than the absolute value of the portion of Vbias, then the current through the resistor 188*a* is greater than the current through the resistor 190*a*. This causes a difference current to flow through the diode 194*a* to the output of the amplifier 198*a*, thus causing the output voltage of the amplifier 198*a* to be negative. But this negative output voltage reverse biases the diode 196*a*, which thus prevents the output of the amplifier 198*a* from sinking a current from the feedback resistor 192*a*. Therefore, because no current flows through the resistor 192*a*, Vgain-control1 equals and cannot go lower than 0 V, which is the voltage at the inverting terminal of the amplifier 198*a*.

Conversely, if the absolute value of Vcontour is less than the absolute value of the portion of Vbias provided by the control 78, then Vgain-control1 equals a positive voltage that depends on the difference between Vcontour and the portion of Vbias. In one embodiment, the more positive Vgain-control1 is, the lower the gain—and thus the higher the attenuation provided by—the PGM1 amplifier in the gain core 99 (FIG. 12). More specifically, if the absolute value of Vcontour is less than the absolute value of the portion of Vbias, then the current through the resistor 188*a* is less than the current through the resistor 190*a*. This causes a difference current to flow through the feedback resistor 192*a* and the forward-biased diode 196*a*, thus causing the output voltage of the amplifier 198*a* to be positive. Therefore, because a feedback current flows through the resistor 192*a*, Vgain-control1 equals a positive value that is proportional to this feedback current. Furthermore, based on this analysis, the cut-off position of the control 78 with respect to Vgain-control1 is the wiper 154 being all the way toward the input resistor 190a such that the control 78 sinks a maximum current from the resistor 190a. Consequently, the full-volume position with respect to Vgain-control1 is the wiper 154 being all the way toward the resistor 190b.

From the above analysis, it is clear that low values of Vcontour cause the attenuation-versus-position curve for Vgain-control1 to have a relatively gradual slope, and high values of Vcontour cause this curve to have a relatively steep slope. Specifically, for relatively low values of Vcontour, a relatively small movement of the arm 154 from the Vgain-control1 full-volume position causes the current through the resistor 190a to become greater than the current through the resistor 188a. Thus, the lower the value of Vcontour, the greater the position range over which the control 78 can generate a positive, i.e., attenuation, voltage for Vgain-control1. Therefore, a low value for Vcontour causes the circuit 142 to provide a attenuation-versus-position curve having a relatively gradual slope like the PGM1 curve of FIG. 11A. Conversely, for relatively large values of Vcontour, a relatively large movement of the arm 154 from the Vgain-control1 full-volume position is needed before the current through the resistor 190a becomes greater than the current flowing through the resistor 188a. Thus, the greater the value of Vcontour, the smaller the position range over which the control 78 can generate a positive, i.e., attenuation, voltage for Vgain-control1. Therefore, a large value for Vcontour causes the circuit 142 to provide an attenuation-versus-position curve having a relatively steep slope like the PGM1 curves of FIGS. 11B and 11C.

Furthermore, as discussed above, in one embodiment, the maximum attenuation that Vgain-control1 causes in PGM1 is constant for any value of Vcontour. Specifically, if R182=R184 and R188a=R190a, then referring to equation (1), Vbias equals −Vcontour plus some constant voltage called K for clarity. If the wiper 154 is in the cutoff position (all the way toward the resistor 190a), then the voltage at the resistor 190a is Vbias=(−Vcontour+K) and the voltage at the resistor 188a is Vcontour regardless of the actual value of Vcontour. Because the resistors 188a and 190a equal the same value R, then the current through the resistor 192a equals (−Vcontour+K)/R+Vcontour/R=−K/R. Thus, the cut-off value of Vgain-control1, which equals K(R192a)/R, is independent of Vcontour. In one embodiment, K is selected such that the amplifier 198a generates the cutoff value of Vgain-control1 high enough to ensure complete cutoff, i.e., at least 90 to 100 dB attenuation, of PGM1 as shown in FIGS. 11A–11C.

The reversal circuit 144 operates in a manner similar to that discussed above in conjunction with FIG. 12.

Although the operation of the crossfader circuit 106 is discussed with respect to the amplifier 198a and Vgain-control1, the operation with respect to the amplifier 198b and Vgain-control2 is similar.

Fader Control Circuit

Figure 14:
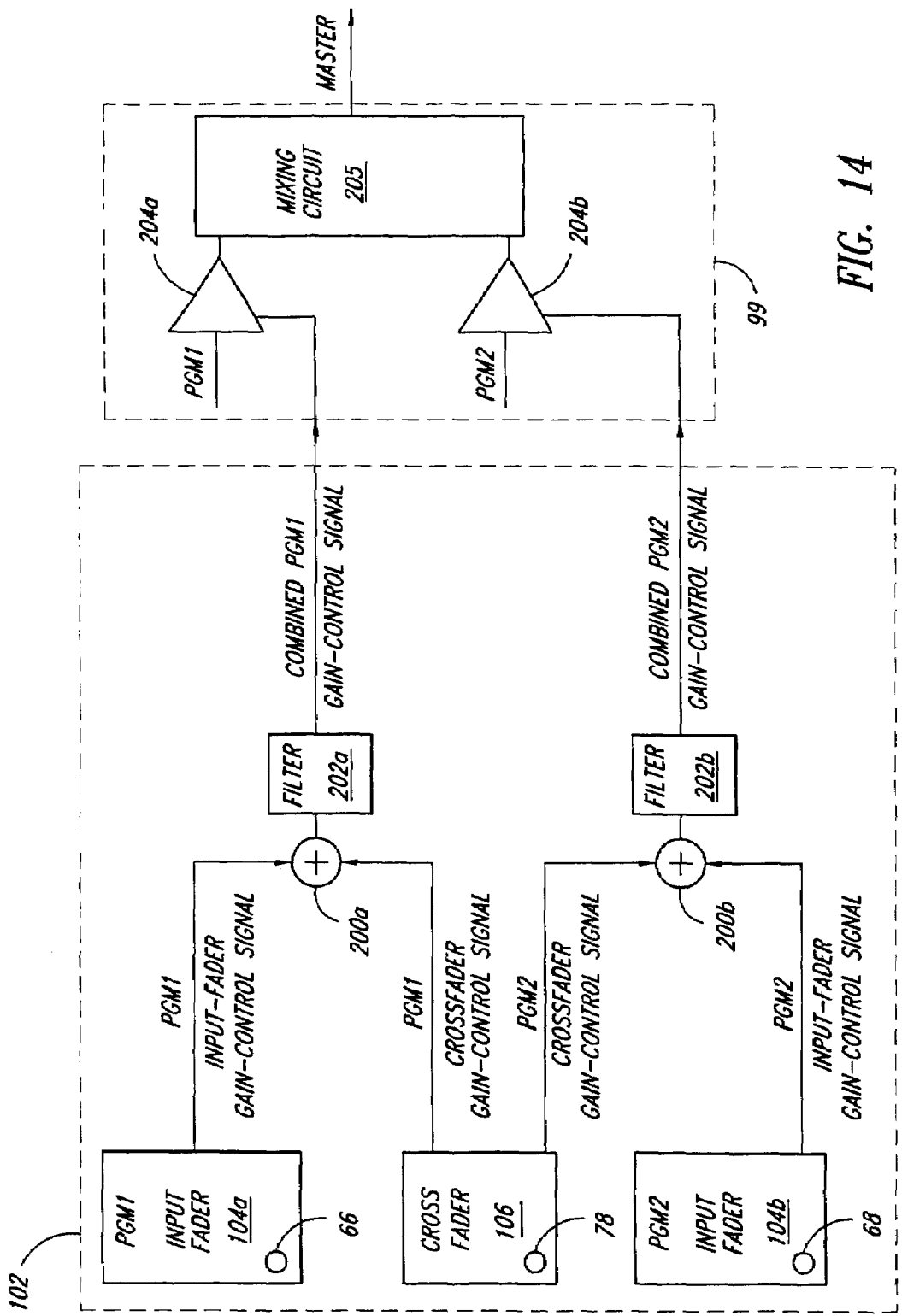
FIG. 14 is a block diagram of an embodiment of the gain core and fader-control circuit of FIG. 6.

FIG. 14 is a block diagram of an embodiment of the gain core 99 and the fader control circuit 102 of FIG. 6 where the circuit 102 combines the gain-control signals from the input-fader circuit 104 and the crossfader circuit 106 into a single gain-control signal for PGM1 and a single gain-control signal for PGM2. Thus, unlike prior-art fader control circuits that require multiple PGM1 and PGM2 amplifiers per channel, the circuit 102 allows the use of only one amplifier per channel. This lowers cost and circuit complexity. Additionally, because active gain control elements have relatively high noise and/or distortion, performance is substantially improved by using only one gain control element per channel.

The circuit 102 includes the input-fader circuit 104 of FIG. 6, which is shown as two circuits 104a and 104b for clarity—one for the PGM1 signal and the other for the PGM2 signal—and includes the crossfader circuit 106 of FIG. 6. The circuit 102 also includes combiner circuits 200a and 200b, which combine the PGM1 input-fader and crossfader gain-control signals and the PGM2 input-fader and crossfader gain-control signals to generate the combined PGM1 and combined PGM2 gain-control signals, respectively. In one embodiment, the combiner circuits 200a and 200b are respective summers. The circuit 102 may also include low-pass filters 202a and 202b for reducing travel noise in the combined PGM1 and combined PGM2 gain-control signals, respectively. As discussed above in conjunction with FIGS. 8 and 10, the input-fader and crossfader circuits 104 and 106 may include their own respective low-pass filters such that the circuits 202a and 202b can be omitted. But an advantage of including them is that only two filters are needed, whereas four are needed if used in the input-fader and crossfader circuits, one each for the PGM1 and PGM2 gain-control signals generated by the input-fader circuit 104 and one each for the PGM1 and PGM2 gain-control signals generated by the crossfader circuit 106.

In one embodiment, the input-fader circuits 104a and 104b are the same as one of the embodiments of the input-fader circuit 104 discussed above in conjunction with FIGS. 6 and 8, and the crossfader circuit 106 is the same as one of the embodiments discussed above in conjunction with FIGS. 6 and 10–13. Alternatively, the input-fader circuits 104a and 104b and the crossfader circuit 106 may be different than these previously described embodiments as long as they provide respective PGM1 and PGM2 input-fader and crossfader gain-control signals to the combiners 200a and 200b.

The gain core 99 includes one PGM1 amplifier 204a, which receives the combined PGM1 gain-control signal from the combiner 200a (via the low-pass filter 202a if included), and one PGM2 amplifier 204b, which receives the combined PGM2 gain-control signal from the combiner 200b (via the low-pass filter 202b if included). If the gain core 99 is designed for stereophonic signals, then it includes two amplifiers for PGM1, one for PGM1 L and one for PGM1 R, and two amplifiers for PGM2, one for PGM2 L and one for PGM2 R. Both of the PGM1 amplifiers receive the combined PGM1 gain-control signal, and both of the PGM2 amplifiers receive the combined PGM2 gain-control signal. The gain core 99 also includes a mixing circuit 205, which mixes the amplified PGM1 and PGM2 signals to generate the MASTER signal.

In operation, the input-fader circuits 104a and 104b respectively generate PGM1 and PGM2 input-fader gain-control signals, for example as discussed above in conjunction with FIG. 8. Likewise, the crossfader circuit 106 generates PGM 1 and PGM 2 crossfader gain-control signals, for example the signals gain-control1 and gain-control2 as discussed above in conjunction with FIGS. 10–13. The combiner circuit 200a combines the PGM1 input-fader and crossfader gain-control signals to generate the combined PGM1 gain-control signal, and the combiner circuit 200b combines the PGM2 input-fader and crossfader gain-control signals to generate the combined PGM2 gain-control signal. The filters 202a and 202b filter the combined PGM1 and PGM2 gain-control signals to reduce travel noise as discussed above. The circuits 202a and 202b then provide these filtered gain-control signals to the amplifiers 204a and 204b. As discussed above, the combined PGM1 and combined PGM2 gain-control signals control the gains of the amplifiers 204a and 204b, and thus to control the volumes and volume ratio of PGM1 and PGM2 in the MASTER signal. The mixer circuit 205 then mixes PGM1 and PGM2 from the amplifiers 204a and 204b, respectively, to generate the MASTER signal.

Figure 15:
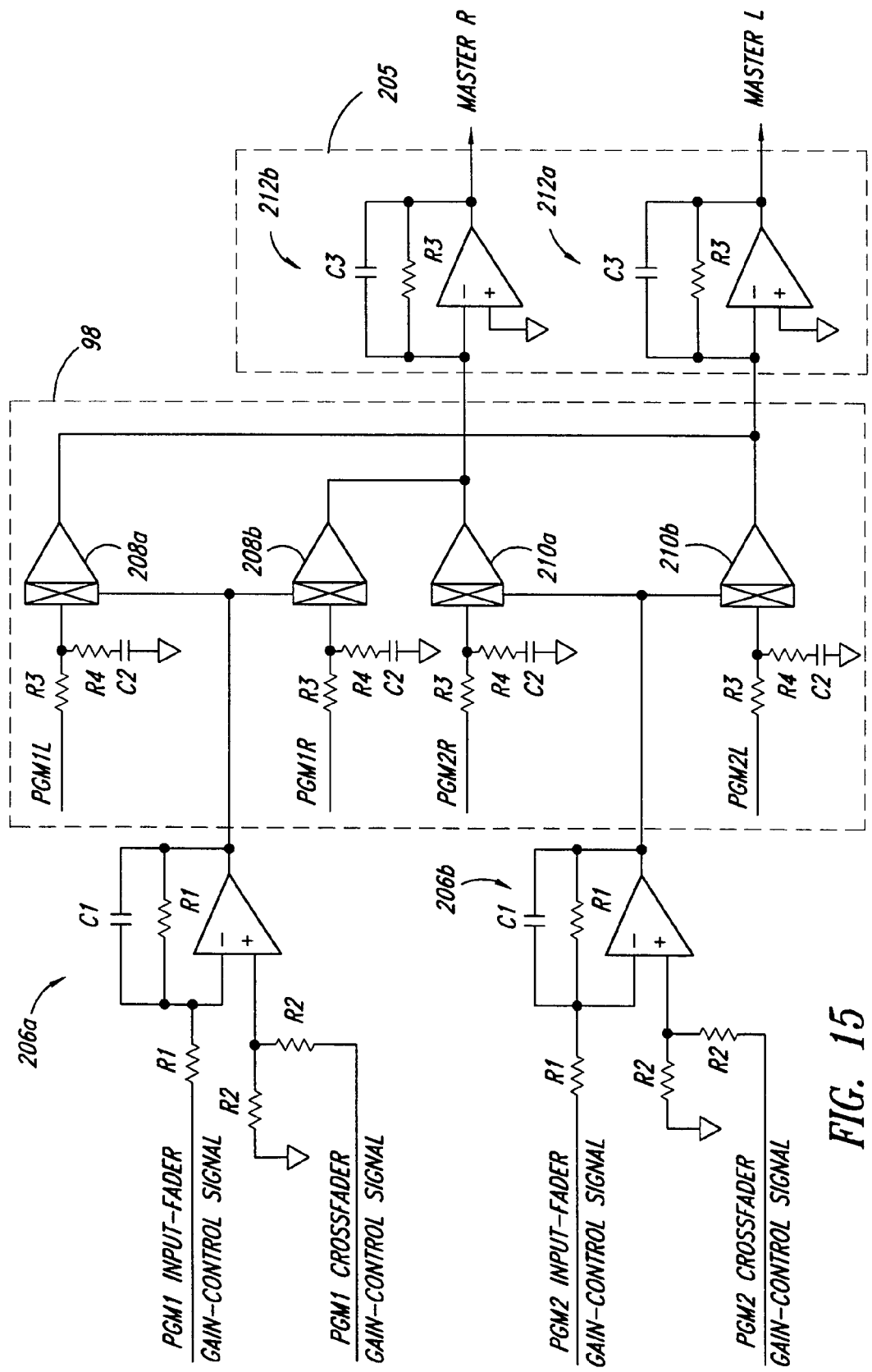
FIG. 15 is a schematic diagram of an embodiment of the gain core of FIG. 14.

FIG. 15 is a schematic diagram of an embodiment of the combiner circuits 200a and 200b, filters 202a and 202b, and the gain core 99 of FIG. 14. A combination summer and filter circuit 206a performs the functions of the combining circuit 200a and the filter 202a, and a combination summer and filter circuit 206b performs the functions of the combining circuit 200b and the filter 202b. Specifically, the circuits 206a and 206b are summing integrators that add the PGM1 and PGM2 input-fader and crossfader gain-control signals together to generate the combined PGM1 and combined PGM 2 gain-control signals, respectively. The respective integration time constants of the circuits 206a and 206b are long enough to reduce travel noise but are short enough to avoid undesirable limiting of the maximum rate of change with respect to time of the combined PGM1 and combined PGM2 gain-control signals, respectively. That is, the circuits 206a and 206b effectively limit the rate at which the turntablist can vary the volumes of PGM1 and PGM2, but typically not to an extent that is noticeable to the turntablist. Furthermore, the circuits 206a and 206b symmetrically delay the respective attack and decay rates of the combined PGM1 and combined PGM2 gain-control signals. That is, the delay is substantially the same for both increases and decreases in the levels of these gain-control signals. Thus, the turntablist can count on the same volume response no matter which way he moves the input-fader and crossfader controls 66, 68, and 78 (e.g., FIG. 5A). In one embodiment, the circuits 206a and 206b have respective corner frequencies in the range of approximately 10–50 Hz, for example approximately 45 Hz.

In this embodiment, the gain core 99 processes stereo signals, and includes voltage-controlled amplifiers 208a and 208b for PGM1 L and PGM1 R, respectively, and includes voltage-controlled amplifiers 210a and 210b for PGM2 L and PGM2 R, respectively. In this embodiment, the gains of these amplifiers is inversely proportional to the respective combined PGM1 and combined PGM2 gain-control signals. That is, as the gain-control voltage rises, the amplifier gain falls. In other embodiments, however, the amplifiers 208a, 208b, 210a, and 210b may have gains that are proportional to the gain-control voltage, or may be current-controlled instead of voltage-controlled. The mixing circuit 205 includes a summer 212a for combining PGM1 L and PGM2 L into MASTER L, and includes a summer 212b for combining PGM1 R and PGM2 R into MASTER R.

Still referring to FIG. 15, the values of the resistors and capacitors for one embodiment of the circuits 99 and 102 are as follows: R1=1.1 MΩ, R2=100 kΩ, R3=30.1 kΩ, R4=511 Ω, C1=0.01 μF, C2=470 pF, and C3=47 pF. It is understood, however, that these values can be modified according to known circuit design principles to generate other embodiments of the invention.

Tone-control Circuit

Figure 16:
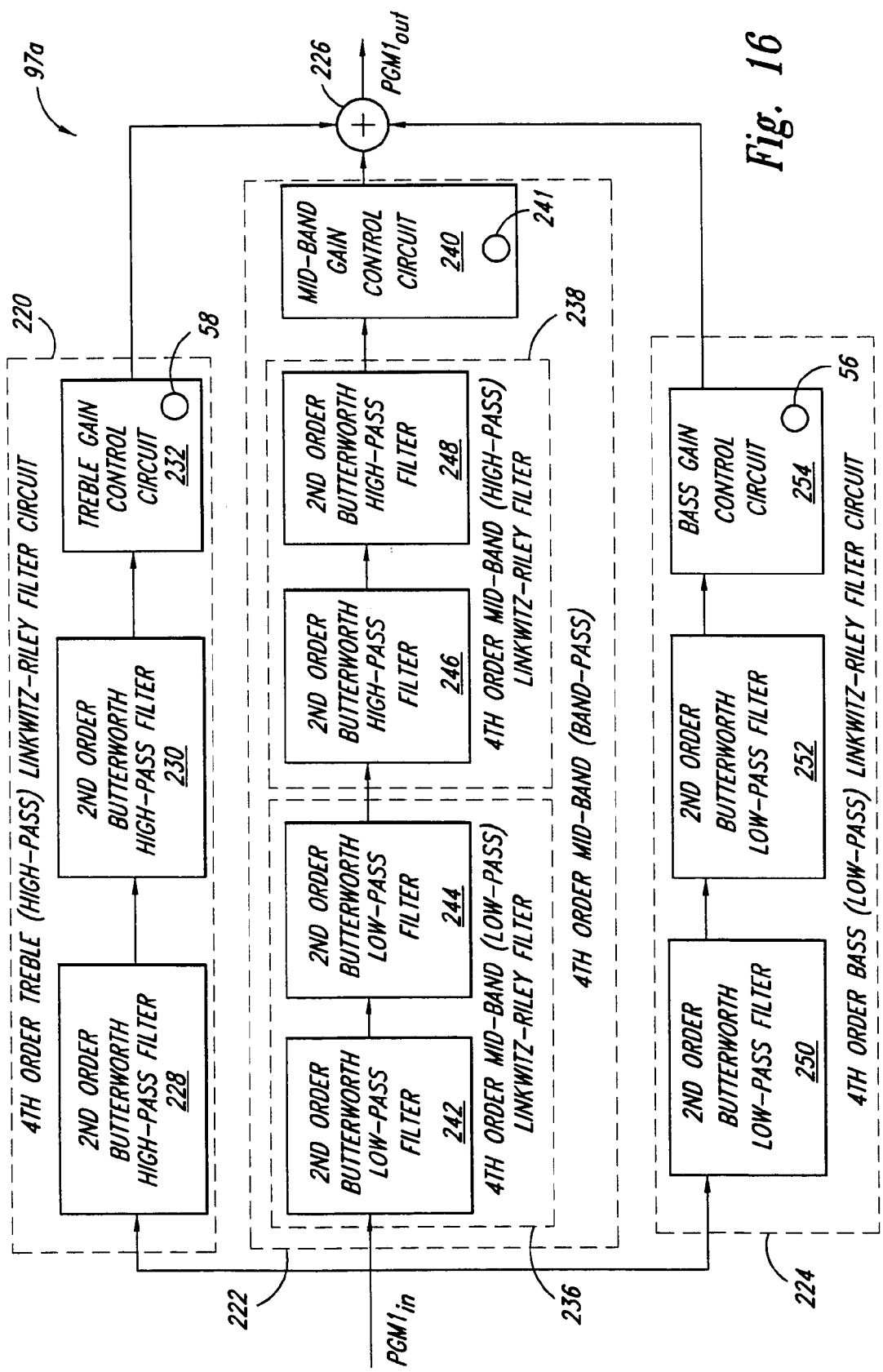
FIG. 16 is a block diagram of an embodiment of one of the tone-control circuits of FIG. 6.

FIG. 16 is a block diagram of an embodiment of the PGM1 tone-control circuit 97a of FIG. 6, it being understood that the PGM2 tone-control circuit 97b is similar. For stereo signals, it is understood that there are four tone-control circuits that are similar to the circuit 97a, one each for PGM1 L, PGM1 R, PGM2 L, and PGM2 R.

In this embodiment, the PGM1 tone-control circuit 97a is a $4^{th}$-order tone-control circuit having three filter circuits: a $4^{th}$-order high-pass, i.e., treble, filter circuit 220, a $4^{th}$-order band-pass, i.e., mid-band, filter circuit 222, and a $4^{th}$-order low-pass, i.e., bass, filter circuit 224. The filter circuits 220, 222, and 224 are coupled in parallel such that they each receive PGM1 and provide a respective filtered component of PGM1 to a combiner circuit 226, which combines the filtered components to generate PGM1 out. In one embodiment, the circuit 226 is a summer.

Each of the filter circuits 220, 222, and 224 has a Linkwitz-Riley alignment, which causes these filter circuits to have identical or nearly identical phase responses regardless of their respective gains. Thus, because the signals from these circuits all have the same or nearly the same phase, one can add these signals together to obtain a filtered PGM1 signal having little or no amplitude or phase distortion. That is, one can independently vary the respective gain of each filter path without significantly changing the phase response of that path, and thus without causing a significant amplitude error in the filtered PGM1 signal. The filter circuits 220, 222, and 224 also have the same or nearly the same respective corner frequencies so that the tone-control circuit 97a has relatively stable and precise high and low corner frequencies. Thus, the tone-control circuit 97a provides steep cutoff slopes and allows independent gain control of the filtered bass-band, mid-band, and treble-band PGM1 components with fewer parts, a less complex design, and a smaller layout area than prior-art tone-control circuits.

In one embodiment, the treble filter circuit 220 includes two serially cascaded $2^{nd}$-order high-pass filters 228 and 230 in series with a gain-control circuit 232, which includes the treble gain control 58 (e.g., FIG. 5A). Each of the filters 228 and 230 has a Butterworth alignment, and the serial combination of the filters 228 and 230 has a Linkwitz-Riley alignment such that the phase response of the filter circuit 220 is constant or nearly constant regardless of the setting of the treble control 58. Additionally, the filters 228 and 230 each have the same or nearly the same corner frequencies, and thus the filter circuit 220 has the same or nearly the same corner frequency as the filters 228 and 230.

In one embodiment, the mid-band filter circuit 222 includes a $4^{th}$-order low-pass filter 236 and a $4^{th}$-order high-pass filter 238, which are serially cascaded, and a gain-control circuit 240, which is in series with the filters 236 and 238 and which includes a mid-band gain control 241. Although the filter 236 is shown in front of the filter 238, the positions of these filters can be reversed without affecting the operation of the filter circuit 222. Each of the filters 236 and 238 has the Linkwitz-Riley alignment such that the phase response of the filter circuit 222 is constant or nearly constant regardless of the setting of the control 241 and is the same or nearly the same as the phase response of the treble filter circuit 220. The filters 236 and 238 have high and low corner frequencies, respectively, and the filter circuit 222 has the same or nearly the same high and low corner frequencies as the filters 236 and 238. Additionally, the high corner frequency of the filter 236, and thus the high corner frequency of the filter circuit 222, is the same or nearly the same as the corner frequency of the treble filter circuit 220.

In one embodiment, the low-pass filter 236 of the mid-band filter circuit 222 includes two serially cascaded $2^{nd}$- order low-pass filters 242 and 244, which each have the same or nearly the same high corner frequencies. Thus, the filter 236 and the filter circuit 222 have the same or nearly the same high corner frequency as the filters 242 and 244. Additionally, each of the filters 242 and 244 has the Butterworth alignment, and the series combination of these filters has the Linkwitz-Riley alignment.

In one embodiment, the high-pass filter 238 of the mid-band filter circuit 222 includes two serially cascaded $2^{nd}$-order high-pass filters 246 and 248, which each have the same or nearly the same low corner frequencies. Thus the filter 238 and the filter circuit 222 have the same or nearly the same low corner frequency. Additionally, each of the filters 246 and 248 has the Butterworth alignment, and the series combination of these filters has the Linkwitz-Riley alignment.

In one embodiment, the bass filter circuit 224 includes two serially cascaded $2^{nd}$-order low-pass filters 250 and 252 in series with a gain-control circuit 254, which includes the bass gain control 56 (e.g., FIG. 5A). Each of the filters 250 and 252 has the Butterworth alignment, and the serial combination of these filters has the Linkwitz-Riley alignment such that the phase response of the filter circuit 224 is constant or nearly constant regardless of the setting of the control 56, and is the same or nearly the same as the phase response of filter circuits 220 and 222. The filters 250 and 252 each have the same or nearly the same corner frequency, and thus the filter circuit 224 has the same or nearly the same corner frequency as the filters 250 and 252. Additionally, the corner frequency of filter 224 is the same or nearly the same as the low corner frequency of filter 222.

Figure 17:
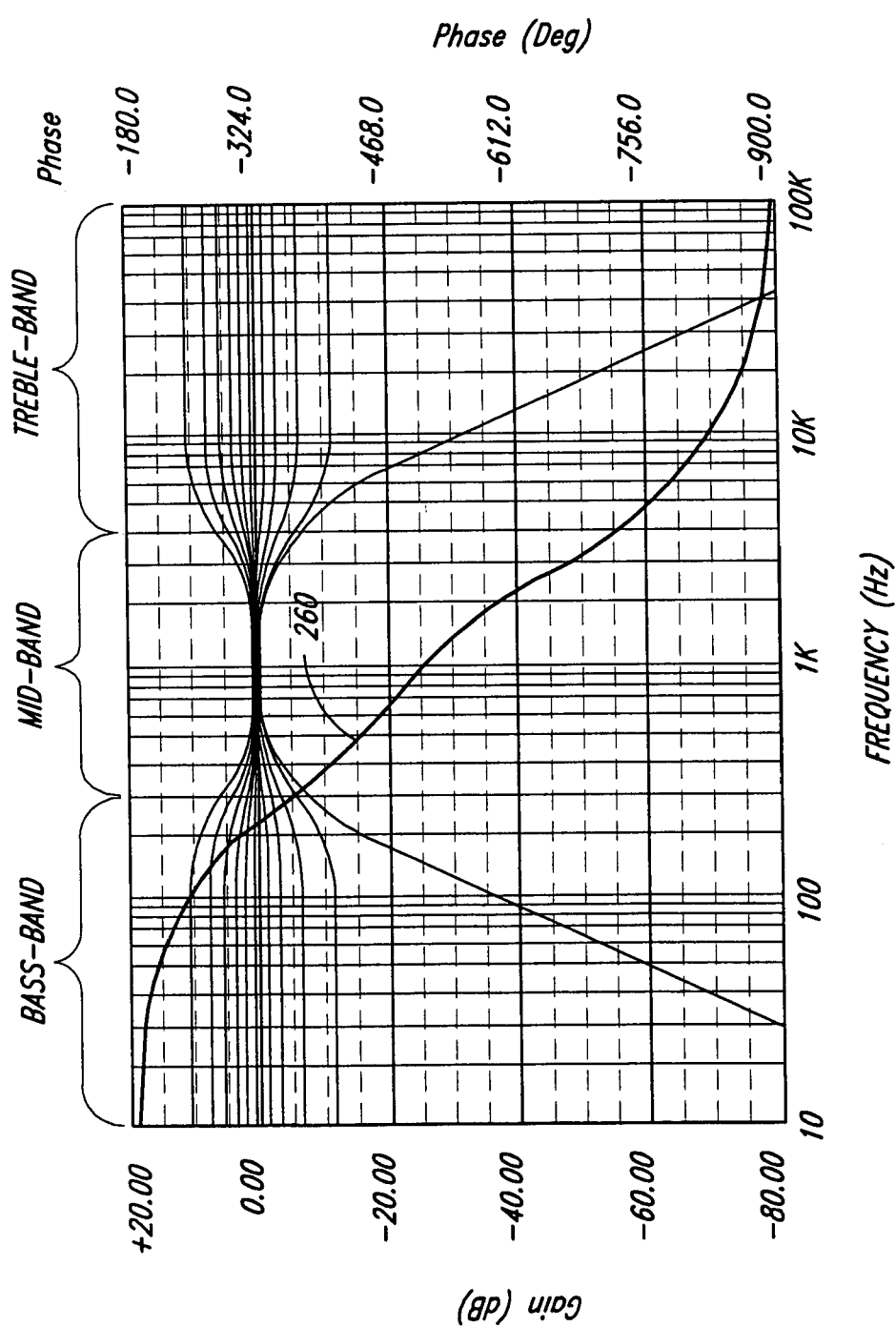
FIG. 17 is a Bode plot of the gain and phase responses for an embodiment of the tone-control circuit of FIG. 16 showing respective ranges of the bass-band and treble-band gains.
Figure 18:
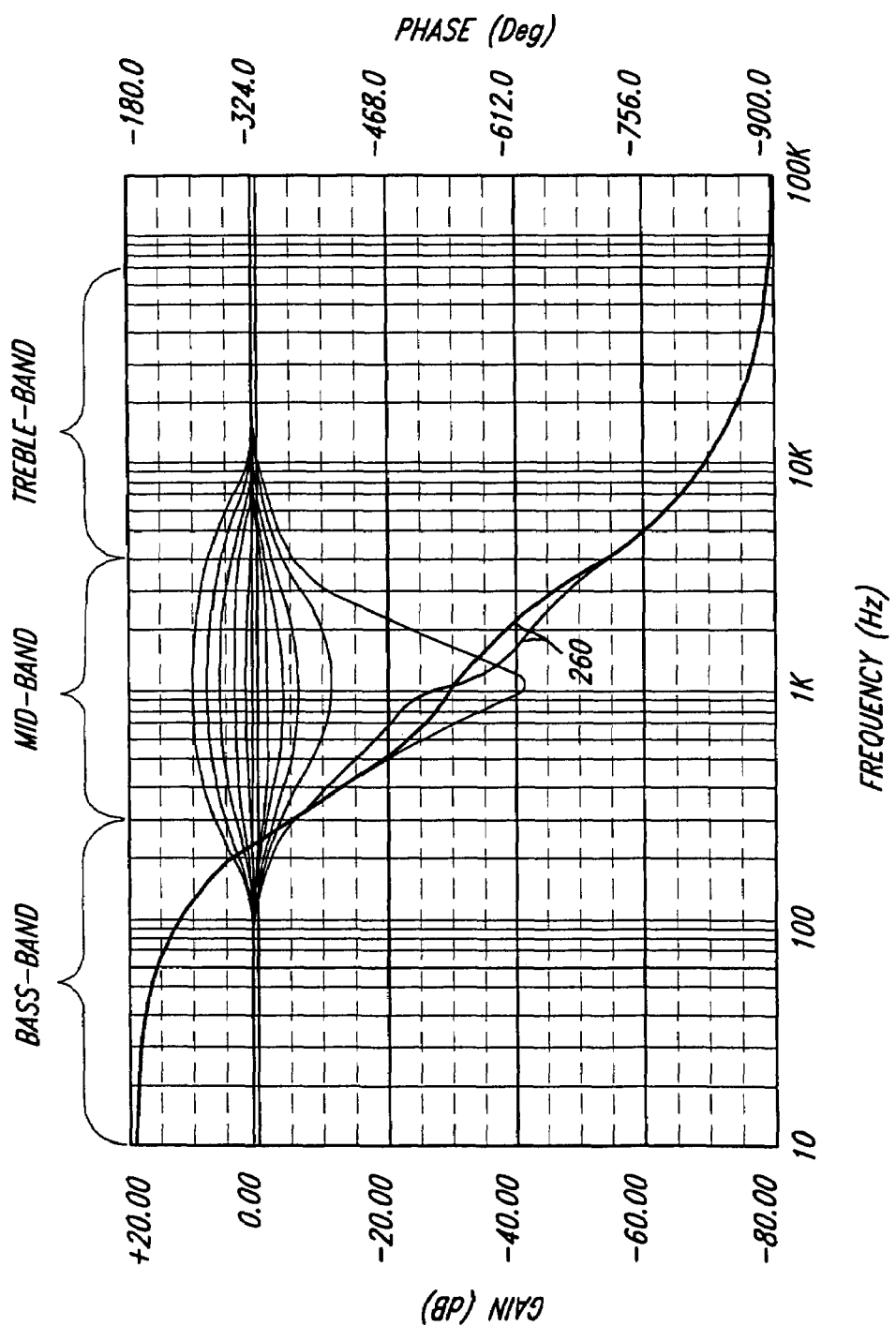
FIG. 18 is a Bode plot of the gain and phase for the tone-control circuit of FIG. 16 showing a range for the mid-band gain.

FIGS. 17 and 18 are Bode plots of the gain and phase responses of an embodiment of the tone-control circuit 97a of FIG. 16 showing ranges of bass-band, mid-band, and treble-band gains. The gains of the filter circuits 220, 222, and 224 are or are approximately 6 dB down at their respective corner frequencies such that if each of these filter circuits has unity gain, the magnitudes of the filtered PGM1 components at the corner frequencies sum to approximately 0 dB such that the gain of the circuit 97a is substantially flat (at approximately 0 dB) over the bass, mid, and treble-bands. One corner frequency of the circuit 97a, which is the same or nearly the same as the corner frequencies of the filter circuits 222 and 224, is within a range of 250 to 400 Hz, with a preferred value of 300 Hz. Similarly, the other corner frequency of the circuit 97a, which is the same or nearly the same as the corner frequencies of the filter circuits 220 and 222, is within a range of 3 to 5 kHz, with a preferred value of 4 kHz.

Referring to FIG. 17, the circuit 97a provides steep cutoff slopes which allow isolation of a musical track such as a singing voice. Thus, these steep slopes allow the turntablist to cut or isolate the bass frequencies, which are typically below 300 Hz, the mid-band frequencies, which are typically in the range of 300 Hz to 4 kHz, or the treble frequencies, which are typically above 4 kHz, so that they are inaudible to a listener. For example, the frequencies in a human voice are typically between 500 Hz and 4 kHz. Thus, the turntablist can isolate a voice by putting the bass and treble controls 56 and 58 in their respective cutoff positions. This embodiment of the tone-control circuit 97a has cutoff slopes steep enough to provide approximately 40 dB of bass cut at 100 Hz and 40 dB of treble cut at 12 kHz as shown. These levels of cut are typically sufficient to isolate voice frequencies from bass and treble tracks. Furthermore, the bass and treble filter circuits 220 and 224 have maximum gains of approximately 10 dB, and the mid-band circuit 222 lacks the gain-control circuit 240 and thus has unity gain.

Still referring to FIG. 17, the phase-response curve 260 is actually a representation of the overlapping phase-response curves of the filter circuits 220, 222, and 224. As shown, because the circuits 220, 222, and 224 have the Linkwitz-Riley alignment, they have the same or nearly the same phase response regardless of their respective gains.

FIG. 18 is a Bode plot of an embodiment the circuit 97a of FIG. 16 where the mid-band filter circuit 222 includes the gain-control circuit 240 and has a gain range of approximately +10 dB to −40 dB (the gain ranges of the treble and bass filter circuits 220 and 224 are omitted for clarity). Again, the steep cutoff slopes of the circuit 97a and the nearly identical phase responses of the filter circuits 220, 222, and 224 are evident.

Figure 19:
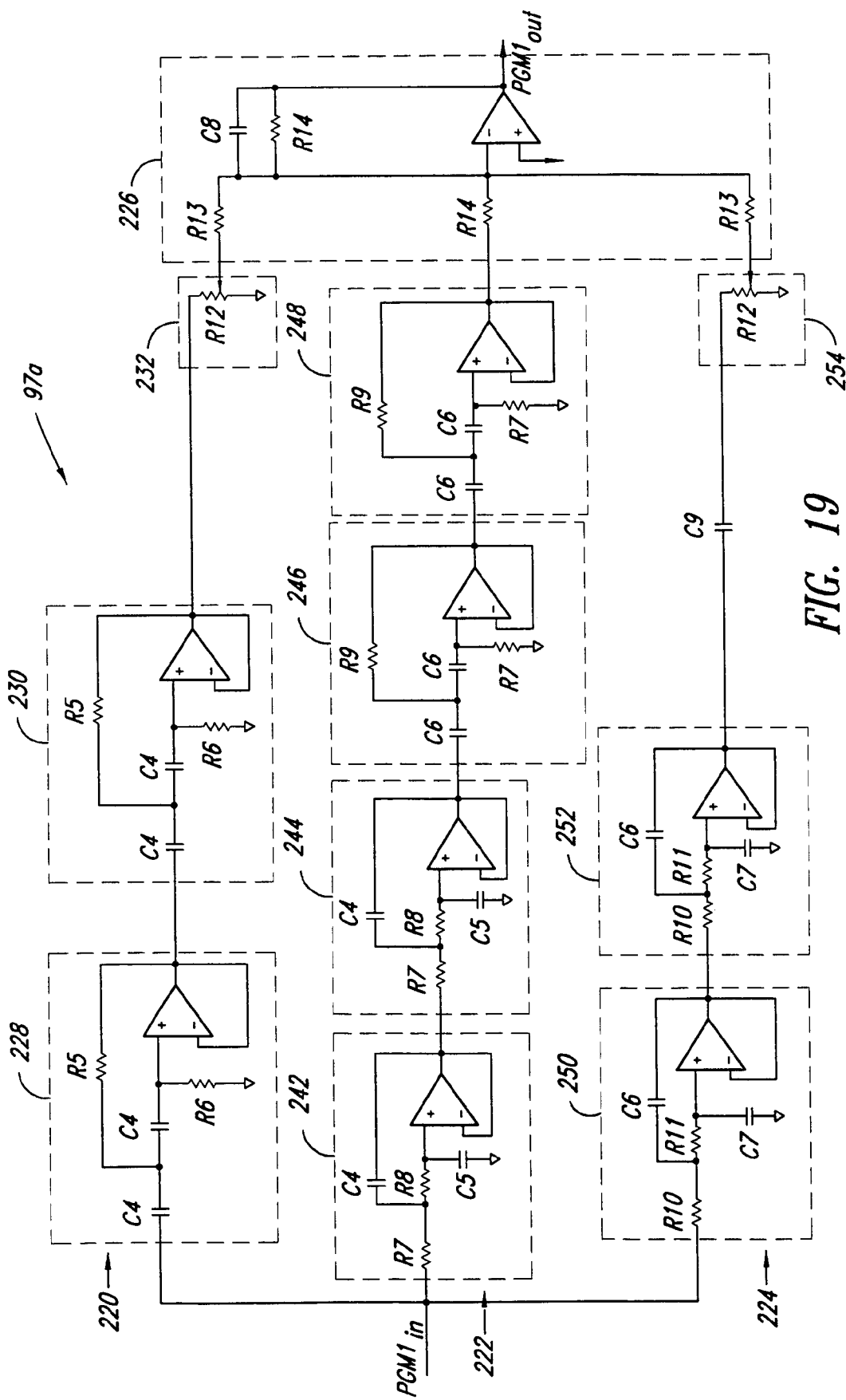
FIG. 19 is a schematic diagram of an embodiment of the tone-control circuit of FIG. 16.

FIG. 19 is a schematic diagram of an embodiment of the tone-control circuit 97a of FIG. 16 that provides gain and phase responses similar to those discussed above in conjunction with the Bode plot of FIG. 17. In this embodiment, the mid-band filter circuit 222 does not include the gain-control circuit 240. In other embodiments, however, the circuit 222 includes a gain-control circuit 240 that is similar to the gain-control circuits 232 and 254. Furthermore, each of the filters 228, 230, 242, 244, 246, 248, 250, and 252 has a Sallen and Key topology and the Butterworth alignment, although in other embodiments these filters may have other topologies or may not all have the same topology. Additionally, in one embodiment, the resistors and capacitors have the following values: R5=2.87 kΩ, R6=5.62 kΩ, R7=7.50 kΩ, R8=4.42 kΩ, R9=3.74 kΩ, R10=10.0 kΩ, R11=6.04 kΩ, R12=20.0 kΩ, R13=9.53 kΩ, R14=30.1 kΩ, C4=0.01 μF, C5=0.0047 μF, C6=0.1 μF, C7=0.047 μF, C8=82.0 pF, and C9=10.0 μF. These values, however, may be changed according to established circuit-design principles to develop other embodiments of the invention.

Figure 20:
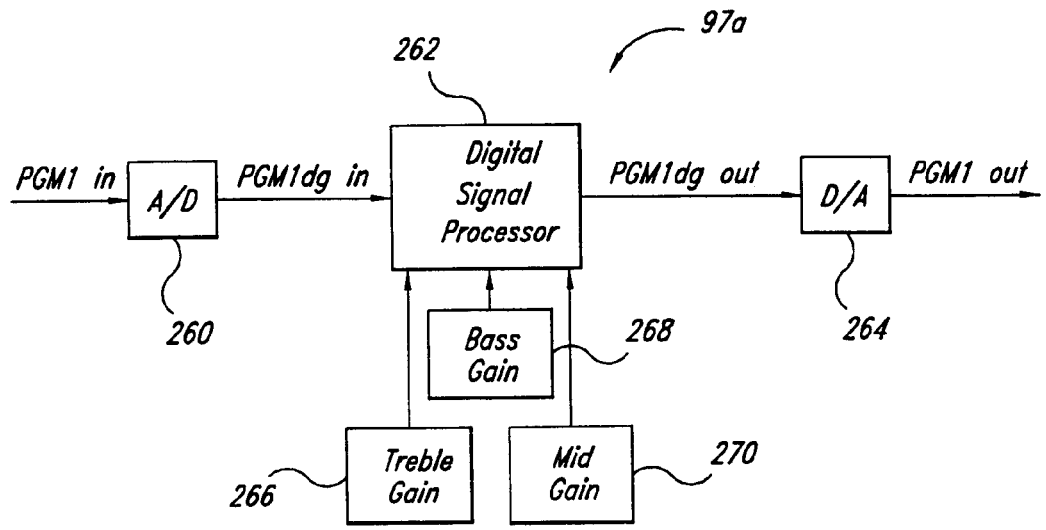
FIG. 20 is a block diagram of another embodiment of the tone-control circuit of FIG. 16.

FIG. 20 is a block diagram of another embodiment of the tone-control circuit 97a of FIG. 6, which filters PGM1 in the digital domain instead of in the analog domain. The circuit 97a includes an analog-to-digital (A/D) converter 260, which converts the PGM1_in analog signal into a PGM1dg_in digital signal. The circuit 97a also includes a digital signal processor (DSP) or other digital processing circuit 262, which digitally separates PGM1dg_in into its bass-band, mid-band, and treble-band components in a manner similar to that discussed above in conjunction with FIG. 16. The DSP 262 combines these components to generate a digital output signal PGM1dg_out, which a digital-to-analog (D/A) converter 264 converts into the analog output signal PGM1_out. For example, the DSP 262 may sum the bass-band, mid-band, and treble-band components together to generate PGM1dg_out. Additionally, the circuit 97a includes treble-, bass-, and mid-band gain circuits 266, 268 and 270, which allow the turntablist to independently adjust the amplitudes of the bass-band, mid-band, and treble-band components, respectively, of PGM1dg_in. Although the A/D and D/A converters 260 and 264 are shown separate from the DSP 262, in other embodiments the DSP 262 incorporates one or both of the A/D and D/A converters 260 and 264.

Figure 21:
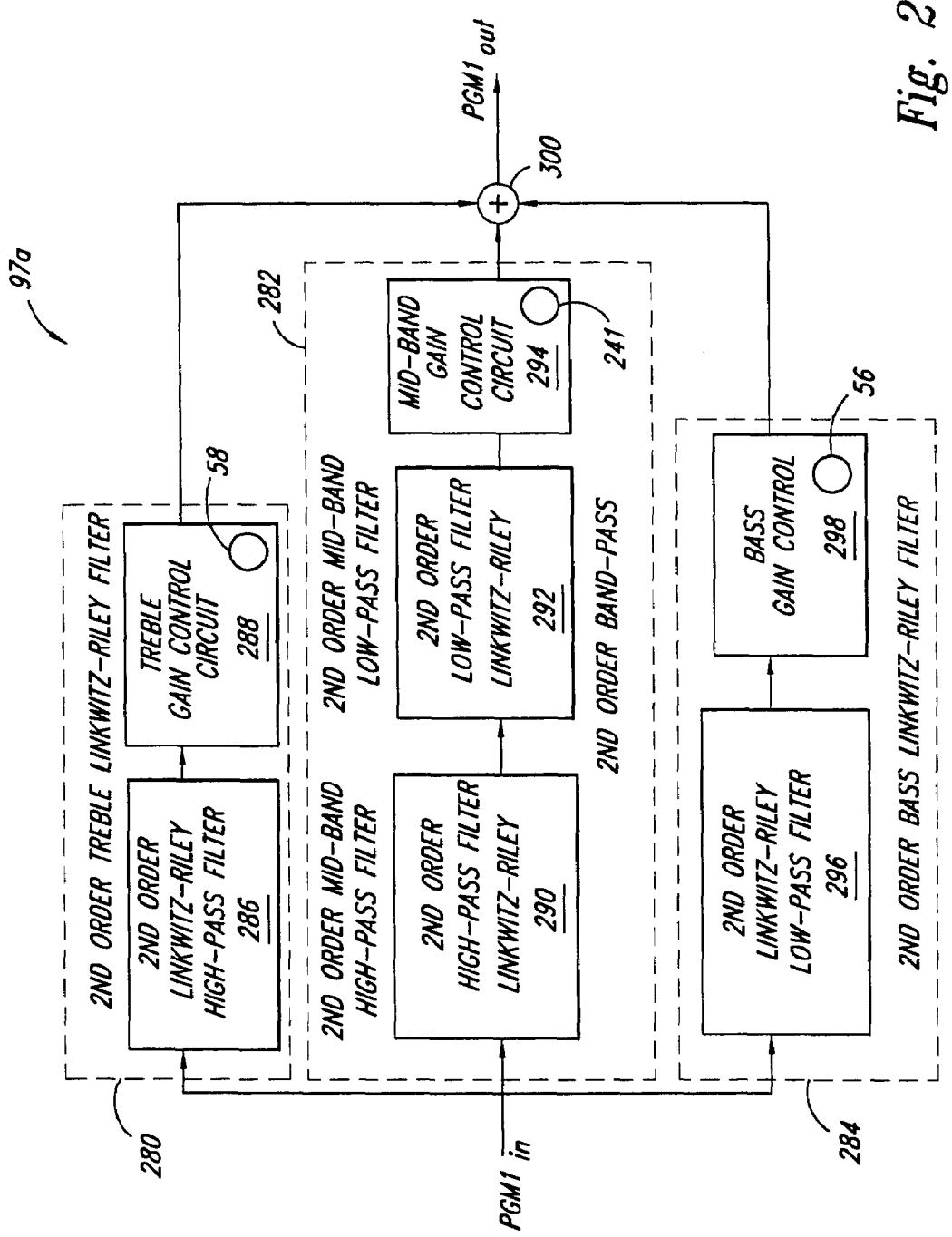
FIG. 21 is a block diagram of another embodiment of the tone-control circuits of FIG. 6.

FIG. 21 is a block diagram of another embodiment of the PGM1 tone-control circuit 97a of FIG. 6, it being understood that the PGM2 tone-control circuit 97b is similar. For stereo signals, it is understood that there are four tone-control circuits that are similar to the circuit 97a, one each for PGM1 L, PGM1 R, PGM2 L, and PGM2 R.

In this embodiment, the PGM1 tone-control circuit 97a is a $2^{nd}$-order tone-control circuit having three filter circuits: a $2^{nd}$-order high-pass, i.e., treble, filter circuit 280, a $2^{nd}$-order band-pass, i.e., mid-band, filter circuit 282, and a $2^{nd}$-order low-pass, i.e., bass, filter circuit 284. Like the filter circuits 220, 222, and 224 of FIG. 16, the filter circuits 280, 282, and 284 are coupled in parallel such that they each receive PGM1 and provide a respective filtered component of PGM1 to a combiner circuit 300, which combines the filtered components to generate PGM1_out. In one embodiment, the circuit 300 is a summer.

Each of the filter circuits 280, 282, and 284 has the Linkwitz-Riley alignment such that they have the same or nearly the same phase response. The filter circuits 280, 282, and 284 also have the same or nearly the same respective corner frequencies so that the tone-control circuit 97a has relatively stable and precise high and low corner frequencies. Thus, the $2^{nd}$-order tone-control circuit 97a provides steep cutoff slopes and allows independent gain control of the filtered bass-band, mid-band, and treble-band PGM1 components with fewer parts, a less complex design, and a smaller layout area than prior-art tone-control circuits and the tone-control circuit 97a of FIG. 16.

The treble filter circuit 280 includes a $2^{nd}$-order high-pass filter 286 in series with a gain-control circuit 288, which includes the treble control 58 (e.g., FIG. 5A). The filter 286 has the Linkwitz-Riley alignment, and its corner frequency is the corner frequency of the filter circuit 280.

The mid-band filter circuit 282 includes a $2^{nd}$-order high-pass filter 290 and a $2^{nd}$-order low-pass filter 292, which are serially cascaded, and an optional gain-control circuit 294, which is in series with the filters 290 and 292 and which includes the mid-band gain control 241. Each of the filters 290 and 292 has the Linkwitz-Riley alignment. Although the filter 290 is shown in front of the filter 292, the positions of these filters can be reversed without affecting the operation of the filter circuit 282. The corner frequencies of the filters 290 and 292 are the low and high corner frequencies, respectively, of the filter circuit 282, and the corner frequency of the filter 292 is the same or nearly the same as the corner frequency of the treble filter circuit 280. In one embodiment, the filter 290 has a non-inverting topology and the filter 292 has an inverting topology. In another embodiment, however, the filter 290 has an inverting topology and the filter 292 has a non-inverting topology. In yet another embodiment, both of the filters 290 and 292 have either inverting or non-inverting topologies and are in series with an inverter (not shown) to give the proper phase characteristics to the mid-band filter circuit 282.

The bass filter circuit 284 includes a $2^{nd}$-order low-pass filter 296 in series with a gain-control circuit 298, which includes the bass control 56 (e.g., FIG. 5A). The filter 296 has the Linkwitz-Riley alignment, and its corner frequency is the corner frequency of the filter circuit 284 and is the same or nearly the same as the low corner frequency of the filter circuit 282.

In operation, the $2^{nd}$-order tone-control circuit 97a operates in a manner similar to that described in conjunction with FIG. 16 for the $4^{th}$-order tone-control circuit 97a. Because this tone-control circuit 97a is of the $2^{nd}$ order, it includes significantly fewer components than the $4^{th}$-order tone-control circuit of FIG. 16. Thus, the $2^{nd}$-order tone-control circuit 97a of FIG. 21 occupies less circuit-board area and is significantly less expensive than the $4^{th}$-order tone-control circuit of FIG. 16.

Figure 22:
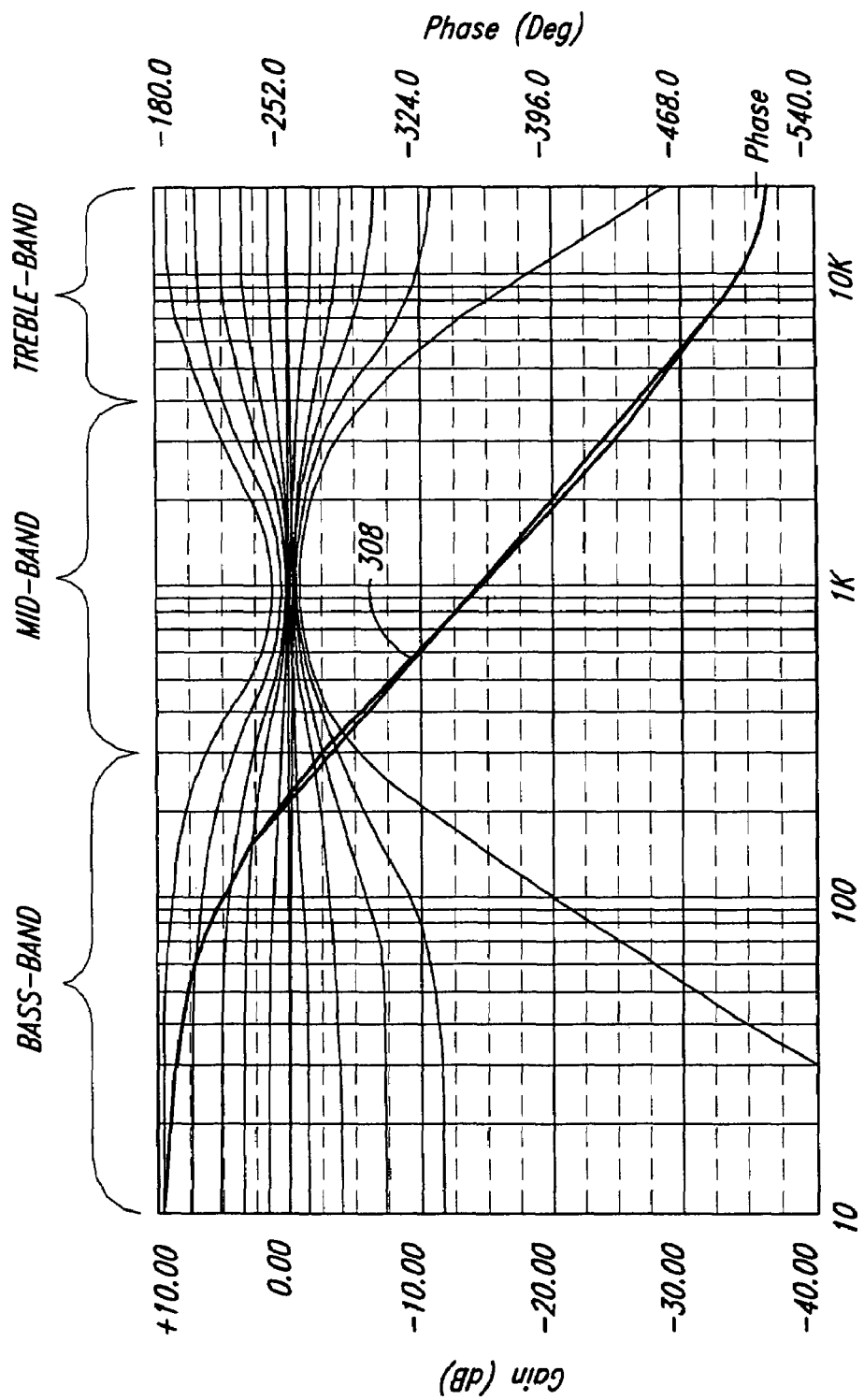
FIG. 22 is a Bode plot of the gain and phase responses for an embodiment of the tone-control circuit of FIG. 21 showing respective ranges for the bass-band and treble-band gains.
Figure 23:
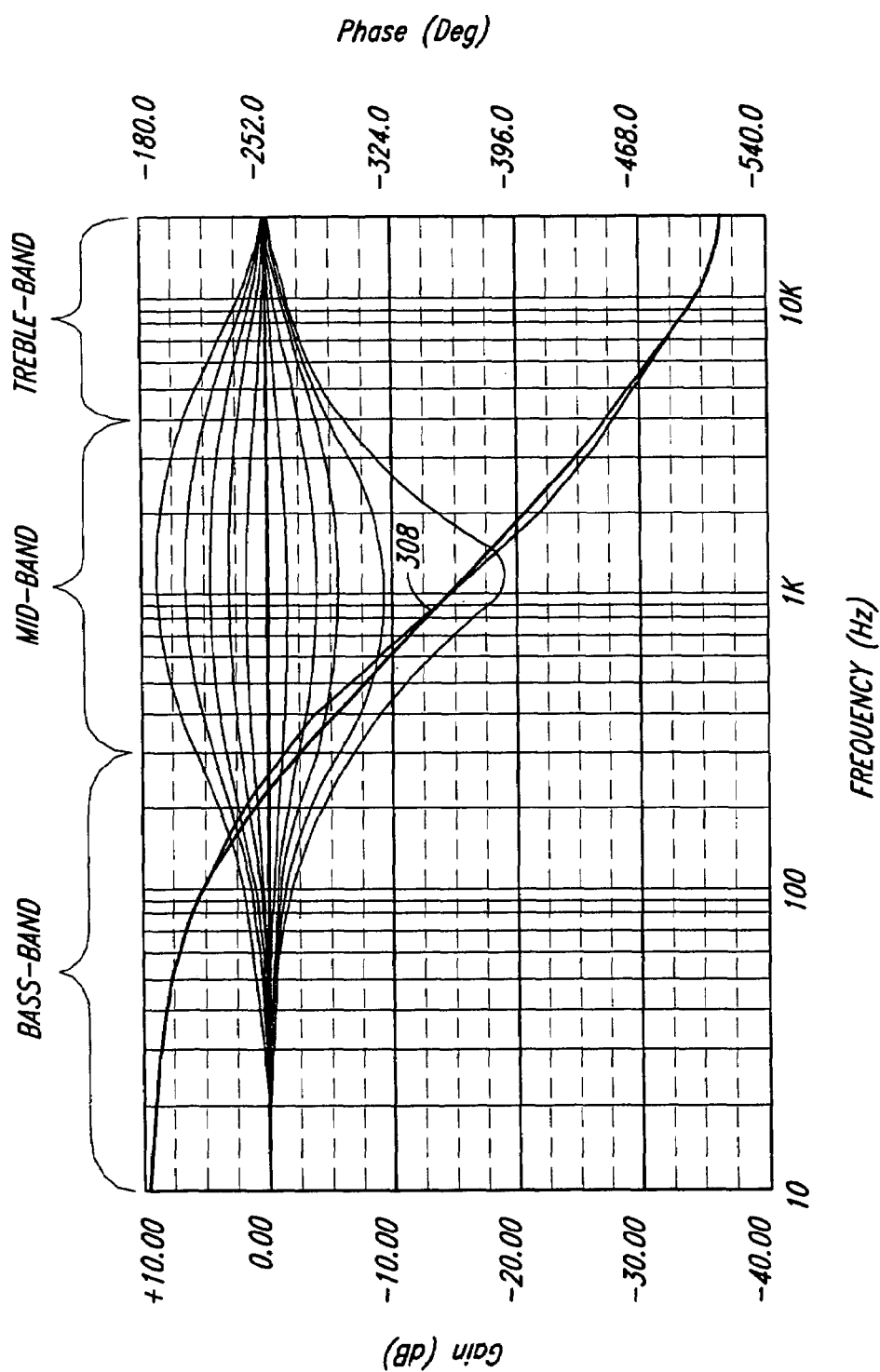
FIG. 23 is a Bode plot of the gain and phase responses for an embodiment of the tone-control circuit of FIG. 21 showing a range for the mid-band gain.

FIGS. 22 and 23 are Bode plots of the gain and phase responses of an embodiment of the $2^{nd}$-order tone-control circuit 97a of FIG. 21 for ranges of the bass-band, mid-band, and treble-band gains. The gains of the filter circuits 280, 282, and 284 are or are approximately 6 dB down at their respective corner frequencies such that if each of the filters circuits has unity gain, the magnitudes of the filtered PGM1 components at the corner frequencies sum to approximately 0 dB such that the gain of the circuit 97a is substantially flat (at approximately 0 dB) over the bass-, mid-, and treble-bands. The low corner frequency of the circuit 97a is within a range of 250 to 400 Hz, with a preferred value of 300 Hz. Similarly, the high corner frequency of the circuit 97a is within a range of 3 to 5 kHz with a preferred value of 4 kHz. Referring to FIG. 22, the $2^{nd}$-order circuit 97a thus provides steep cutoff slopes—although not as steep as the cutoff slopes of the $4^{th}$-order circuit 97a of FIG. 16—that allow reasonable isolation of a musical track such as a singing voice. This embodiment of $2^{nd}$-order tone-control circuit 97a has cutoff slopes steep enough to provide approximately 20 dB of bass cut at 100 Hz and 20 dB of treble cut at 12 kHz. Furthermore, the bass and treble filter circuits 280 and 284 have maximum gains of approximately 10 dB, and the mid-band circuit 282 lacks the gain-control circuit 294 and thus has unity gain.

Still referring to FIG. 22, the phase-response curve 308 is a representation of the overlapping phase-response curves of the filter circuits 280, 282, and 284. As shown, because the filter circuits 280, 282, and 284 have the Linkwitz-Riley alignment, they have the same or nearly the same phase response regardless of their respective gains.

FIG. 23 is a Bode plot of an embodiment the $2^{nd}$-order tone-control circuit 97a of FIG. 21 where the mid-band filter circuit 282 includes the gain-control circuit 294 and has a gain range of approximately +10 dB to −20 dB. Again, the steep cutoff slopes of the $2^{nd}$-order circuit 97a and the nearly identical phase responses of the filter circuits 280, 282, and 284 are evident.

Figure 24:
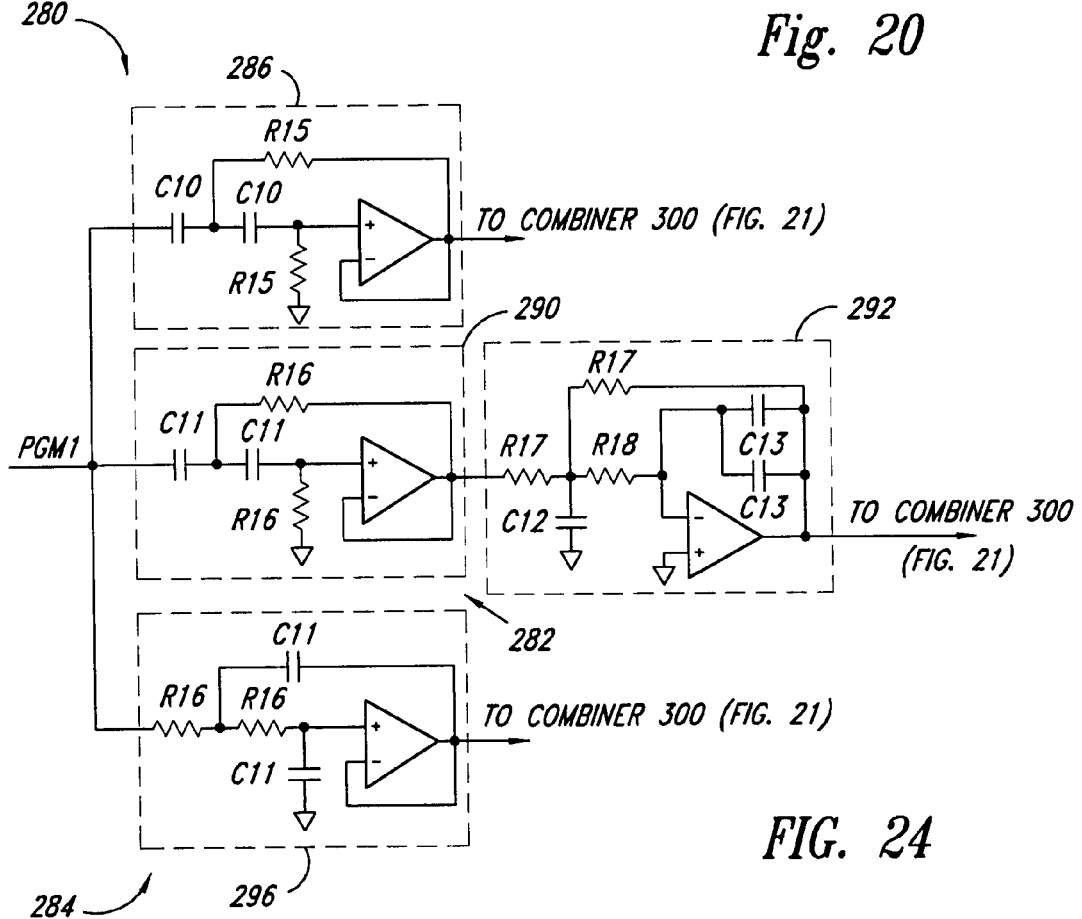
FIG. 24 is a schematic diagram of an embodiment of the tone-control circuit of FIG. 21.

FIG. 24 is a schematic diagram of the embodiment of the filter circuits 280, 282, and 284 that provides the gain and phase responses shown in FIGS. 22 and 23. In this embodiment, the filters 286, 290, and 296 each have the Sallen and Key topology, and the filter 292 has an inverting multiple-feedback topology. In another embodiment, however, the filter 290 has the inverting multiple-feedback topology and the filter 292 has the Sallen and Key topology. In yet another embodiment, both the filters 290 and 292 have either an inverting multiple-feedback topology or a Sallen and Key topology and are in series with an inverter (not shown). Either way, the mid-band filter circuit 282 has an odd number of inversions to give it a proper phase shift. Furthermore, like the high-pass filter 286 and the low-pass filter 296, the high-pass filter 290 and the low-pass filter 292 each have the Linkwitz-Riley alignment. Additionally, in one embodiment, the resistor and capacitor values are as follows: R15=4.02 kΩ, R16=5.36 kΩ, R17=1.91 kΩ, R18=19.1 kΩ, C10=0.01 μF, C11=0.1 μF, C12=0.022 μF, and C13=0.001 μF. These values, however, may be changed according to established circuit-design principles to develop other embodiments of the invention.

Referring to FIGS. 20 and 24, an embodiment of the $2^{nd}$-order tone-control circuit 97a of FIG. 21 is implement digitally using the same basic components and theory of operation as discussed in conjunction with FIG. 20. In this embodiment, the DSP 262 is programmed to digitally implement $2^{nd}$-order bass-, mid-, and treble-band filters having characteristics similar to those described above in conjunction with FIGS. 21–24 for the filter circuits 280, 282, and 284.

Audio-effects Multiplexer

Figure 25:
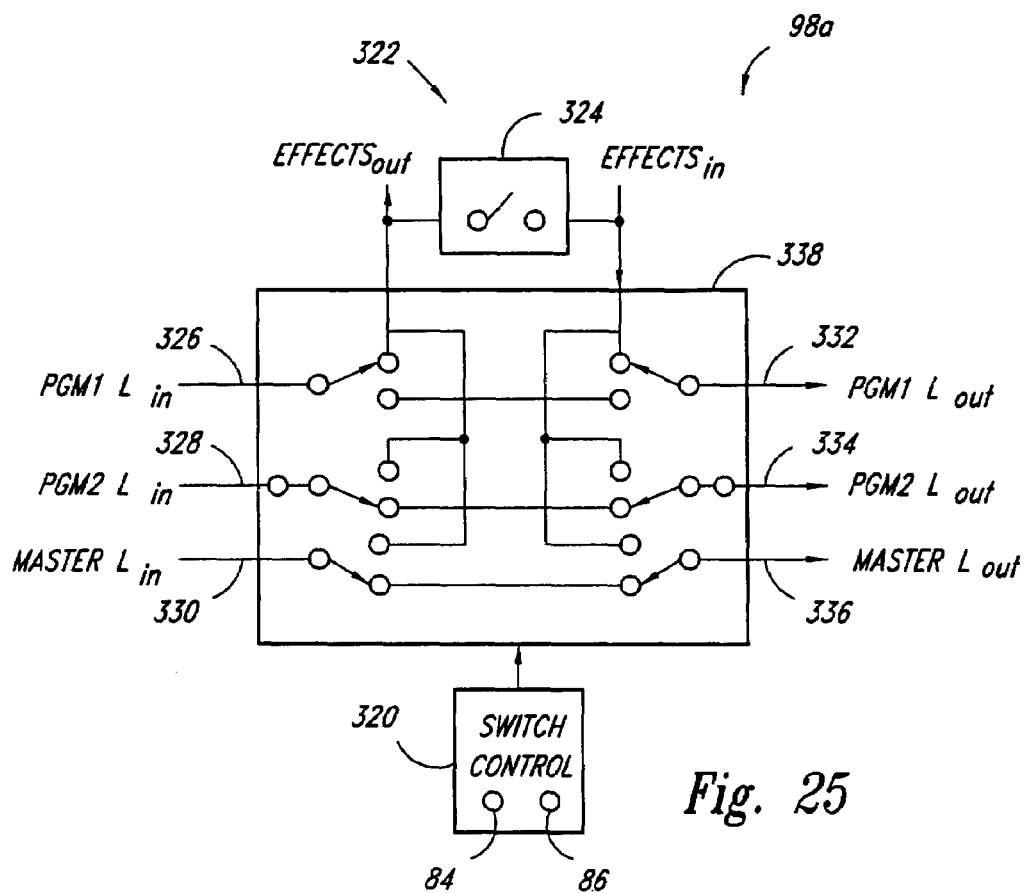
FIG. 25 is a block diagram of an embodiment of the effects-loop multiplexer of FIG. 6.

FIG. 25 is a functional diagram of an embodiment of the effects-path multiplexer 98a of FIG. 7A, an effects connector 322, and a switch circuit 320, which generates a path-selection signal based on the settings of the controls 84 and 86 of FIG. 7A. For clarity, only the portion 98a (FIG. 7A) of the multiplexer 98 (FIG. 6) associated with PGM1 L, PGM2 L, and MASTER L is shown, it being understood that the portion 98b for PGM1 R, PGM2 R, and MASTER R is similar.

The portion 98a includes three input terminals 326, 328, and 330 for respectively receiving PGM1 Lin, PGM2 Lin, and MASTER Lin, and includes three output terminals 332, 334, and 336 for respectively providing PGM1 Lout, PGM2 Lout, and MASTER Lout. The multiplexer portion 98a also includes a switching circuit 338 for routing the input signals in response to the selection signal from the switch circuit 320.

In operation, the turntablist sets the controls 84 and 86 to route the desired one of the input signals PGM1 Lin, PGM2 Lin, and MASTER Lin through the effects box 18 (e.g., FIG. 5D). Alternatively, the turntablist may choose to route none of these input signals through the effects box 18. In the illustrated mode of operation, the switch circuit 320 provides the selection signal having a value that causes the switching circuit 338 to route PGM1 Lin from the input terminal 326, through the effects box 18, and to the output terminal 332 as PGM1 Lout. This value of the selection signal also causes the switching circuit 338 to route the signals PGM2 Lin and MASTER Lin from the input terminals 328 and 330 directly to the corresponding output terminals 334 and 336, respectively. Thus, in this mode, PGM2 Lin and MASTER Lin pass through the multiplexer 98 essentially unaltered. In other modes of operation, the selection signal has respective values that cause the switching circuit 338 to route PGM2 Lin and MASTER Lin through the effects box 18 in a similar manner. Thus, in this embodiment, the switching circuit 338 routes no more than one signal through the effects box 18 at a time. In yet another mode of operation, the selection signal has a value that causes the switching circuit 338 to route none of the signals through the effects box 18. Thus, in this mode, the switching circuit 338 couples the input terminals 326, 328, and 330 directly to the output terminals 332, 334, and 336, respectively.

Still referring to FIG. 25, the connector 322, includes a safeguard mechanism 324, which prevents the turntablist from unintentionally cutting off one of the input signals PGM1 Lin, PGM2 Lin, and MASTER Lin. Specifically, if an effects-box connector (not shown) is connected to the connector 322, the mechanism 324 acts as an open switch between the effects input and output terminals (Effects in, Effects out) of the multiplexer 98a. But if no connector is connected to the connector 322, then the mechanism 324 acts as a closed switch such that the effects input and output terminals are coupled together. Thus, if the effects box 18 (FIG. 5D) is not connected to the mixer 50 (FIG. 5D) and the turntablist accidentally adjusts the controls 84 and 86 to route a signal through the effects box 18, the mechanism 324 acts as a short circuit and routes the signal to the proper output terminal 322, 324, or 326. Without the mechanism 324, the path of the signal inadvertently routed to the effects output terminal would be electrically open, thus cutting off a portion of MASTER Lout if PGM1 Lin or PGM2 Lin is inadvertently routed or completely cutting off MASTER Lout if MASTER Lin is inadvertently routed.

Although the controls 84 and 86 and the switching mechanism 324 are described as mechanical switching components, in other embodiments they are electrical or optical components.

Figure 26A:
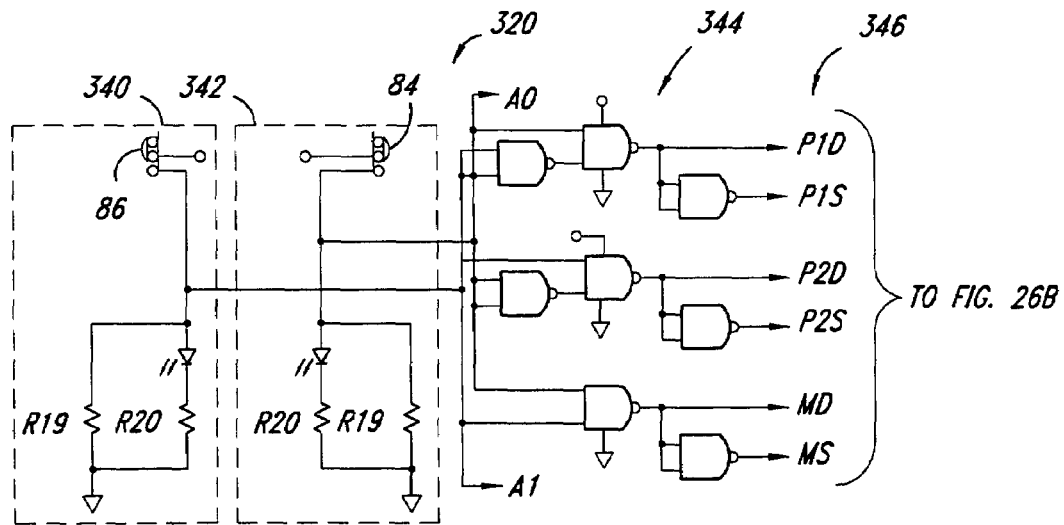
FIGS. 26A–26B are a schematic diagram of an embodiment of the effects-loop multiplexer of FIG. 25.
Figure 26B:
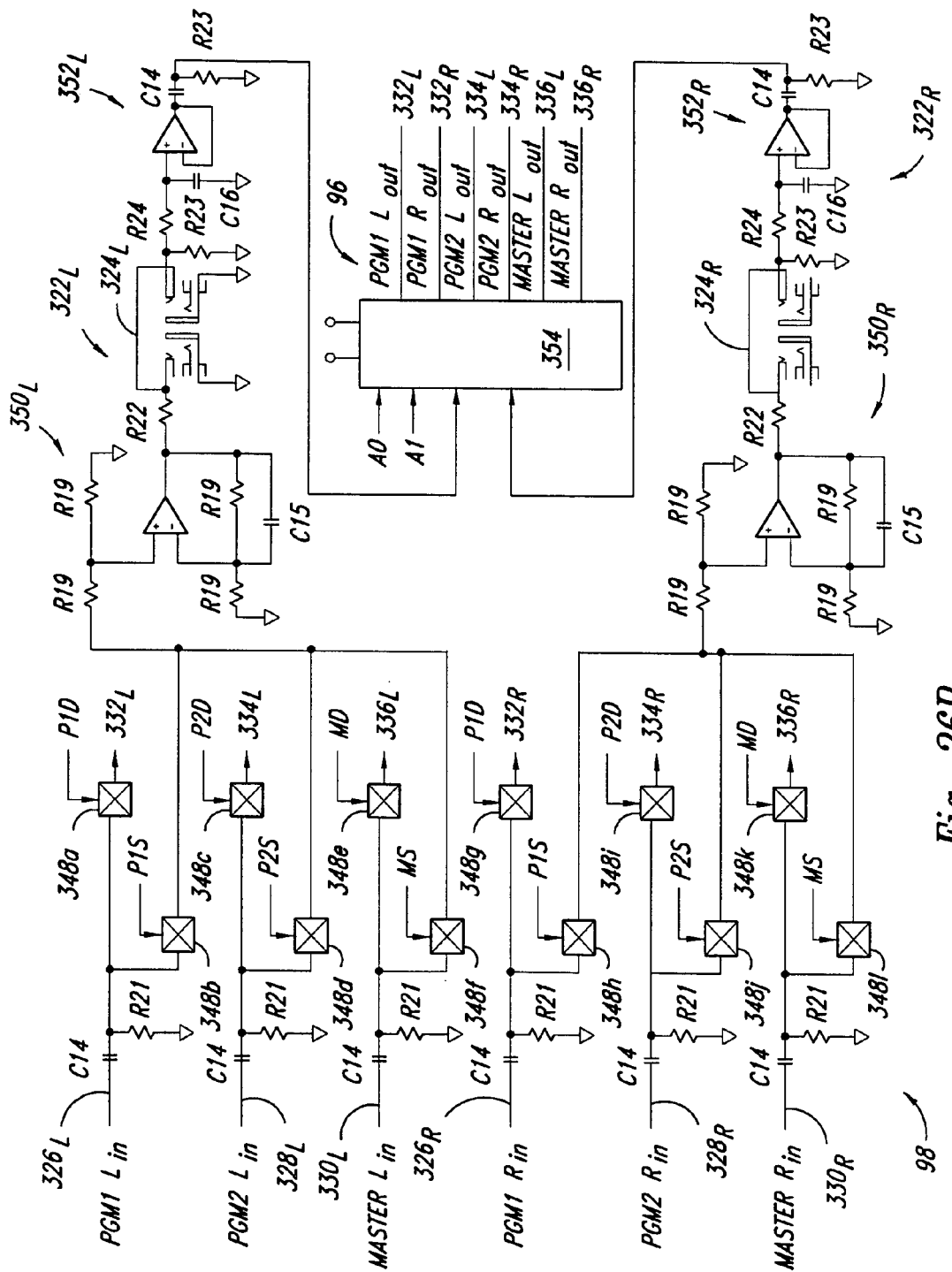

FIGS. 26A and 26B are a schematic diagram of an embodiment of the effects multiplexer 98 of FIG. 6 including the portions 98a and 98b, which are similar to the portions 98a and 98b described in conjunction with FIG. 25. Referring to FIG. 26A, the switch circuit 320 includes two switch sub circuits 340 and 342, which respectively include the switches 86 and 84. The switch circuit 320 also includes a logic circuit 344, which generates components 346 of the selection signal in response to the positions of the switches 84 and 86. Referring to FIG. 26B, the multiplexer 98 also includes a bank of analog input switches 348, which couple the respective input signals either to the effects output terminal or to a respective output terminal 332, 334, or 336. For clarity, these output terminals are shown in two places: at the respective outputs of the switches 348 and at the respective outputs of a selector 354, it being understood that these are the same respective output terminals in an electrical sense. The multiplexer 98 also includes output buffer circuits 350L and 350R, which buffer the respective L and R components of selected input signal that is routed to the effects output terminal (send), and includes input buffer circuits 352L and 352R, which buffer the respective L and R components of the selected signal as it returns from the effects box 18 (e.g., FIG. 5D) at the effects input terminal (return). Additionally, the multiplexer 98 includes the selector 354, which couples the components of the returned signal from the buffer circuits 352 to the appropriate output terminals.

In operation, for the positions of the switches 84 and 86 illustrated in FIG. 26A, the logic circuit 344 generates the selection-signal components P1D, P2D, and MD equal to logic 1, and the components P1S, P2S, and MS equal to logic 0. Therefore, the switches 348a, 348c, 348e, 348g, 348i, and 348k are closed, and the switches 348b, 348d, 348f, 348h, 348j, and 348l are open such that none of the input signals PGM1 L and R, PGM2 L and R, and MASTER L and R are routed through the effects box 18 (e.g., FIG. 5D). Furthermore, the circuit 344 generates values for the components A0 and A1 such that the selector 354 isolates the effects box 18 from the output terminals 332L, 332R, 334L, 334R, 336L, and 336R.

If, however, the switches 84 and 86 are in other positions, the logic circuit 344 generates a respective one of the signals P1D, P2D, or MD equal to logic 0 and the corresponding one of the signals P1S, P2S, and MS equal to logic 1 such that the switches 348 route a selected one of the input signals through the effects box 18. Furthermore the circuit 344 generates values for the components A0 and A1 such that the selector 354 routes the signal returned from the effects box 18 to the proper output terminal 332, 334, or 336. For example, to route PGM1 L and PGM1 R through the effects box 18, the turntablist puts the switches 84 and 86 in respective positions such that the logic circuit generates P1D equal to logic 0, P1S equal to logic 1, P2D and MD equal to logic 1, and P2S and MS equal to logic 0. These values close the switches 348b and 348h to respectively couple PGM1 L and PGM1 R to the buffers 350L and 350R, close the switches 348c, 348e, 348i, and 348k to couple PGM2 L, PGM2 R, MS L, and MS R directly to the respective output terminals 334L, 334R, 336L, and 336R, and open the remaining switches 348. Furthermore, the circuit 344 generates the values of A0 and A1 such that the selector 354 couples the left return signal from the buffer 352L to the output terminal 332L and couples the right return signal from the buffer circuit 352R to the output terminal 332R.

Although described as routing at most only one signal PGM1, PGM2, or MASTER at a time to the effects box 18 (FIG. 5D), other embodiments of the mixer 50 and multiplexer 98 allow the simultaneous routing of multiple signals to one or more effects boxes. Furthermore, in one embodiment, the resistors and capacitors have the following values: R19=10 kΩ, R20=511 Ω, R21=100 kΩ, R22=301 Ω, R23=20 kΩ, R24=1 kΩ, C14>10 μF, C15=47 pF, and C16=330 pF. It is understood, however, that these values may be changed according to established circuit-design principals to develop other embodiment of the invention.

From the foregoing it will be appreciated that, although specific embodiments of the invention have been described herein for purposes of illustration, various modifications may be made without deviating from the spirit and scope of the invention.

What is claimed:

1. An audio-signal circuit, comprising:
audio input and output terminals;
a first series combination of two 2nd-order low-pass filters, the series combination having a first phase response, an input terminal coupled to the audio input terminal, and an output terminal;
a second series combination of two 2nd-order low-pass filters and two $2^{nd}$-order high-pass filters, the second series combination having a second phase response substantially equal to the first phase response, an input terminal coupled to the audio input terminal, and an output terminal;
a third series combination of two 2nd-order high-pass filters, the third series combination having a third phase response substantially equal to the first and second phase responses, an input terminal coupled to the audio input terminal, and an output terminal; and
a combining circuit having first, second, and third input terminals respectively coupled to the output terminals of the first, second, and third series combinations and having an output terminal coupled to the audio output terminal.

2. The audio-signal circuit of claim 1 wherein each filter of the first, second, and third series combinations has a Butterworth alignment.

3. The audio-signal circuit of claim 1 wherein the first series combination of the low-pass filters, the combination of the two low-pass filters and the combination of the two high-pass filters in the second series combination, and the third series combination of the high-pass filters each have a Linkwitz-Riley alignment.

4. The audio-signal circuit of claim 1 wherein:
the first series combination has a first cutoff frequency;
the second series combination has the first cutoff frequency and has a second cutoff frequency that is higher than the first cutoff frequency; and
the third series combination has the second cutoff frequency.

5. The audio-signal circuit of claim 1 wherein:
the first series combination has a cutoff frequency within a first range of approximately 250–400 Hz;
the second series combination has a first cutoff frequency within the first range and has a second cutoff frequency within a second range of approximately 3–5 kHz; and
the third series combination has a cutoff frequency within the second range.

6. The audio-signal circuit of claim 1 wherein:
the first series combination has a cutoff frequency of approximately 300 Hz; the
second series combination has a first cutoff frequency of approximately 300 Hz and has a second cutoff frequency of approximately 4 kHz; and
the third series combination has a cutoff frequency of approximately 4 kHz.

7. The audio-signal circuit of claim 1 wherein:
the first series combination has a first cutoff frequency and a first gain that is −6 dB at the first cutoff frequency;
the second series combination has the first cutoff frequency, a second cutoff frequency that is higher than the first cutoff frequency, and a second gain that is −6 dB at the first and second cutoff frequencies; and
the third series combination has the second cutoff frequency and a third gain that is −6 dB at the second cutoff frequency.

8. The audio-signal circuit of claim 1 wherein:
the first series combination has a gain of approximately −40 dB at 100 Hz; and the third series combination has a gain of approximately −40 dB at 12 kHz.

9. The audio-signal circuit of claim 1 wherein:
the first series combination includes a gain control coupled in series with its two low-pass filters; and
the third series combination includes a gain control coupled in series with its two high-pass filters.

10. The audio-signal circuit of claim 1 wherein the second series combination includes a gain control coupled in series with its two low-pass and two high-pass filters.

11. The audio-signal circuit of claim 1 wherein each filter of the first, second, and third series combinations has a Sallen and Key topology.

12. The audio-signal circuit of claim 1 wherein:
the first, second, and third series combinations have respective first, second, and third gains; and
the first, second, and third phase responses of the first, second, and third series combinations are respectively independent of the first, second, and third gains.

13. The audio-signal circuit of claim 1 wherein the combining circuit comprises a summer.

14. The audio-signal circuit of claim 1 wherein the two 2nd-order low-pass filters of the first series combination, the two 2nd-order low-pass filters and the two 2nd-order high-pass filters of the second series combination, and the two 2nd-order high-pass filters of the third series combination comprise respective digital filters.

15. An audio-signal circuit, comprising: audio input and output terminals;
a 2nd-order low-pass filter that has a first phase response, an input terminal coupled to the audio input terminal, and an output terminal;
a series combination of a 2nd-order low-pass filter and a 2nd-order high-pass filter, the series combination having a second phase response substantially equal to the first phase response, an input terminal coupled to the audio input terminal, and an output terminal; and
a 2nd-order high-pass filter that has a third phase response substantially equal to the first and second phase responses, an input terminal coupled to the audio input terminal, and an output terminal; and
a combining circuit having first, second, and third input terminals respectively coupled to the output terminals of the low-pass filter, series combination of low-pass and high-pass filters, and high-pass filter and having an output terminal coupled to the audio output terminal.

16. The audio-signal circuit of claim 15 wherein:
the low-pass filter, the low-pass and high-pass filters of the series combination, and
the high-pass filter each have a Linkwitz-Riley alignment.

17. The audio-signal circuit of claim 15 wherein:
the low-pass filter, the low-pass and high-pass filters of the series combination, and
the high-pass filter each have a Linkwitz-Riley alignment; and
one of the low-pass and high-pass filters of the series combination has an inverting topology.

18. The audio-signal circuit of claim 15 wherein:
the low-pass filter, the low-pass and high-pass filters of the series combination, and
the high-pass filter each have a Linkwitz-Riley alignment; and
one of the low-pass and high-pass filters of the series combination has an inverting multiple-feedback topology.

19. The audio-signal circuit of claim 15 wherein: the low-pass filter has a first cutoff frequency;
the series combination of the low-pass and high-pass filters has the first cutoff frequency and has a second cutoff frequency that is higher than the first cutoff frequency; and
the high-pass filter has the second cutoff frequency.

20. The audio-signal circuit of claim 15 wherein:
the low-pass filter has a cutoff frequency within a first range of approximately 250–400 Hz;
the series combination of the low-pass and high-pass filters has a first cutoff frequency within the first range and has a second cutoff frequency within a second range of approximately 3–5 kHz; and
the high-pass filter has a cutoff frequency within the second range.

21. The audio-signal circuit of claim 15 wherein:
the low-pass filter circuit has a cutoff frequency of approximately 300 Hz;
the series combination of the low-pass and high-pass filters has a first cutoff frequency of approximately 300 Hz and has a second cutoff frequency of approximately 4 kHz; and
the high-pass filter has a cutoff frequency of approximately 4 kHz.

22. The audio-signal circuit of claim 15 wherein:
the low-pass filter has a first cutoff frequency and a first gain that is −6 dB at the first cutoff frequency;
the series combination of the low-pass and high-pass filters has the first cutoff frequency, a second cutoff frequency that is higher than the first cutoff frequency, and a second gain that is −6 dB at the first and second cutoff frequencies; and
the high-pass filter circuit has the second cutoff frequency and a third gain that is −6 dB at the second cutoff frequency.

23. The audio-signal circuit of claim 15 wherein:
the low-pass filter has a gain of approximately −20 dB at 100 Hz; and the high-pass filter has a gain of approximately −20 dB at 12 kHz.

24. The audio-signal circuit of claim 15, further comprising:
a low-pass gain control coupled in series with the low-pass filter; and a high-pass gain control coupled in series with the high-pass filter.

25. The audio-signal circuit of claim 15, further comprising a gain control coupled in series with the low-pass and high-pass filters of the series combination.

26. The audio-signal circuit of claim 15 wherein each of the low-pass and high-pass filters and one of the filters of the series combination has a Sallen and Key topology.

27. The audio-signal circuit of claim 15 wherein:
the low-pass, high-pass, and series combination of low-pass and high-pass filters have respective first, second, and third gains; and
the first, second, and third phase responses are respectively independent of the first, second, and third gains.

28. The audio-signal circuit of claim 15 wherein the combining circuit comprises a summing circuit.

29. The audio-signal circuit of claim 15 wherein the low-pass filter, the lowpass and high-pass filters of the series combination, and the high-pass filter comprise respective digital filters.

* * * * *